(12) United States Patent
Castro et al.

(10) Patent No.: US 10,729,012 B2
(45) Date of Patent: Jul. 28, 2020

(54) BURIED LINES AND RELATED FABRICATION TECHNIQUES

(71) Applicant: Micron Technology, Inc., Boise, ID (US)

(72) Inventors: Hernan A. Castro, Shingle Springs, CA (US); Stephen W. Russell, Boise, ID (US); Stephen H. Tang, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 7 days.

(21) Appl. No.: 15/961,550

(22) Filed: Apr. 24, 2018

(65) Prior Publication Data

US 2019/0327835 A1  Oct. 24, 2019

(51) Int. Cl.
*H05K 3/00* (2006.01)
*H05K 1/11* (2006.01)
*H05K 3/22* (2006.01)

(52) U.S. Cl.
CPC .......... *H05K 3/0094* (2013.01); *H05K 1/116* (2013.01); *H05K 3/225* (2013.01)

(58) Field of Classification Search
CPC ....... H05K 3/0094; H05K 3/225; H05K 1/116
USPC ................... 29/852, 846, 829, 825, 592.1
See application file for complete search history.

(56) References Cited

U.S. PATENT DOCUMENTS

| 7,233,522 B2 | 6/2007 | Chen et al. |
|---|---|---|
| 9,659,998 B1 | 5/2017 | Lung |
| 9,711,392 B2 * | 7/2017 | Dehe .................. H01L 21/283 |
| 2002/0028558 A1 | 3/2002 | Yang |
| 2004/0062938 A1 | 4/2004 | Kai et al. |
| 2008/0164454 A1 | 7/2008 | Chen |
| 2011/0079836 A1 | 4/2011 | Lin |
| 2013/0223149 A1 | 8/2013 | Kito et al. |
| 2013/0229846 A1 | 9/2013 | Chien et al. |

(Continued)

FOREIGN PATENT DOCUMENTS

| CN | 105280560 A | 1/2016 |
|---|---|---|
| KR | 20120121746 A | 11/2012 |
| KR | 20140018544 A | 2/2014 |

OTHER PUBLICATIONS

Rostami, et al., "Novel dual-$V_{th}$ independent-gate FinFET circuits", Department of Electrical and Computer Engineering, Rice University, Houston, TX., retrieved from http://www.ece.rice.edu/~kmram/publications/PID1069335.pdf, 6 pgs.

Wang, "Independent-Gate FinFET Circuit Design Methodology", IAENG International Journal of Computer Science, 37:1, IJCS_37_1_06, Feb. 1, 2010, 8 pgs.

(Continued)

*Primary Examiner* — Peter Dungba Vo
*Assistant Examiner* — Azm A Parvez
(74) *Attorney, Agent, or Firm* — Holland & Hart LLP

(57) ABSTRACT

Methods, systems, and devices for buried lines and related fabrication techniques are described. An electronic device (e.g., an integrated circuit) may include multiple buried lines at multiple layers of a stack. For example, a first layer of the stack may include multiple buried lines formed based on a pattern of vias formed at an upper layer of the stack. The pattern of vias may be formed in a wide variety of spatial configurations, and may allow for conductive material to be deposited at a buried target layer. In some cases, buried lines may be formed at multiple layers of the stack concurrently.

14 Claims, 9 Drawing Sheets

(56) References Cited

U.S. PATENT DOCUMENTS

| | | |
|---|---|---|
| 2014/0048761 A1 | 2/2014 | Nojiri et al. |
| 2014/0241026 A1* | 8/2014 | Tanzawa .................. G11C 5/06 365/72 |
| 2014/0332875 A1 | 11/2014 | Kim et al. |
| 2015/0008503 A1* | 1/2015 | Makala ............. H01L 27/11582 257/324 |
| 2015/0108562 A1 | 4/2015 | Chen et al. |
| 2015/0179258 A1 | 6/2015 | Castro |
| 2015/0236038 A1 | 8/2015 | Pachamuthu et al. |
| 2015/0280118 A1 | 10/2015 | Lee et al. |
| 2015/0340406 A1 | 11/2015 | Jo |
| 2017/0148811 A1 | 5/2017 | Zhang et al. |
| 2017/0207273 A1 | 7/2017 | Sciarrillo et al. |
| 2017/0271463 A1 | 9/2017 | Lim et al. |
| 2017/0309681 A1 | 10/2017 | Tanaka et al. |
| 2017/0358629 A1 | 12/2017 | Hu et al. |
| 2018/0090373 A1 | 3/2018 | Sharangpani et al. |
| 2018/0108669 A1 | 4/2018 | Zhu et al. |

OTHER PUBLICATIONS

ISA/KR, International Search Report and Written Opinion of the International Searching Authority, Int'l. Appl. No. PCT/US2019/023887, dated Jul. 9, 2019, Korean Intellectual Property Office, Seo-gu, Daejeon, Republic of Korea, 13 pgs.

ISA/KR, International Search Report and Written Opinion of the International Searching Authority, Int'l. Appl. No. PCT/US2019/024531, dated Jul. 12, 2019, Korean Intellectual Property Office, Seo-gu, Daejeon, Republic of Korea, 13 pgs.

ISA/KR, International Search Report and Written Opinion of the International Searching Authority, Int'l. Appl. No. PCT/US2019/024533, dated Aug. 6, 2019, Korean Intellectual Property Office, Seo-gu, Daejeon, Republic of Korea, 13 pgs.

IPO, "Office Action," issued in connection with ROC (Taiwan) Patent Application No. 108112071, dated Dec. 11, 2019 (7 pages).

IPO, "Office Action," issued in connection with ROC (Taiwan) Patent Application No. 108112416, dated Dec. 9, 2019 (4 pages).

Taiwanese Intellectual Property Office, "Office Action," issued in connection with Application No. 108112414, dated Mar. 27, 2020, 33 pages with translation.

* cited by examiner

BURIED LINES AND RELATED FABRICATION TECHNIQUES

BACKGROUND

The following relates generally to electronic memory devices and integrated circuits, and more specifically to buried lines and related fabrication techniques.

In the context of electronic devices (e.g., integrated circuits), buried lines may refer to one or more conductive lines located below a top surface of a stack of materials. Examples of buried lines may include electrodes, circuit traces, interconnects, or—in the example of a memory device—access lines, such as bit lines or word lines. In some fabrication processes, lines located at a buried layer (e.g., below the top layer of the aforementioned stack) of a stack may be constructed when the layer is at the top of the stack (e.g., before layers that ultimately may be above the given layer are formed), or may be constructed using techniques that are repeated for each of multiple levels of the stack (e.g., multiple memory decks of a 3D memory device), which may increase a number of requisite processing steps (e.g., masking steps) as well as processing times and associated fabrication costs.

Improved fabrication techniques and structures for buried lines in electronic devices (e.g., integrated circuits, including memory devices), are desired.

DETAILED DESCRIPTION

Figure 1A:
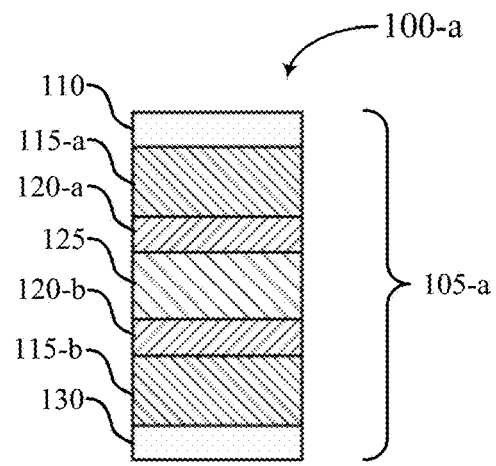
FIGS. 1A through 1C illustrate an example of a composite stack that supports forming buried lines and related fabrication techniques in accordance with examples of the present disclosure.

Some electronic devices (e.g., integrated circuits), such as memory devices, may include a stack of various materials, which may in some cases be referred to as a composite stack. One or more layers of the stack below the uppermost layer (e.g., surface layer) of the stack, which may be referred to as buried layers, may include conductive lines, which may be referred to as buried lines. Examples of buried lines may include electrodes, circuit traces, interconnects, or—in the example of a memory device—access lines.

Compared to other fabrication techniques for forming buried lines, the fabrication techniques described herein may beneficially reduce a number of processing steps (e.g., masking or other photolithographic steps, deposition steps, or etching steps) as well as reduce fabrication time and costs. For example, the fabrication techniques described herein may beneficially support the construction of buried lines at multiple buried layers (including, but not limited to, simultaneous construction). As another example, the fabrication techniques described herein may beneficially support the construction of buried lines subsequent to the formation (e.g., deposition) of layers that are above the buried layer that includes the buried lines (e.g., while the buried layer is buried), whereas other fabrication techniques may be constrained to forming buried lines in a given layer before forming any above layers (e.g., before the buried layer becomes buried). These benefits are merely exemplary, and one of ordinary skill may appreciate further benefits of the techniques and structures described herein.

In accordance with the teachings herein, buried lines may be formed by patterning vias (e.g., access vias) arranged in a desired shape (e.g., a linear or non-linear pattern or configuration) at a top layer of the stack. The vias may be utilized to remove materials (e.g., concurrently, simultaneously) from one or more target buried layers (e.g., a layer in which a buried access line is to be formed) to form respective channels, or tunnels, in the stack of materials. The channels may be concurrently filled with conductive material, which may form buried lines.

In some cases, the same vias may be used to create additional, narrower channels within the conductive material that was used to fill another, earlier-formed channel. Creating the narrower channel within the conductive material may result in an elongated loop (e.g., a band, a ring, a racetrack) of conductive material surrounding the narrower channel at the target buried layer, and the narrower channel may be filled with a second material (e.g., a dielectric or other insulating material). The loop of conductive material may subsequently be severed to create discrete segments of the conductive material at the target buried layer, each of which may comprise a buried line. Further, such channel-fabrication and loop-fabrication techniques may be repeated within the second material to create one or more additional buried lines surrounded by the loop of conductive material (or segments thereof).

In some examples, the fabrication techniques described herein may be used to form buried access lines at multiple layers of a 3D memory device. For example, the resulting memory device may include multiple decks of memory cells, and each deck may include one or more buried access lines. In some examples, such a memory device may be or may have a 3D cross-point architecture. Accordingly, each deck of memory cells in the cross-point architecture may include a plurality of first access lines (e.g., word lines) in a first plane and a plurality of second access lines (e.g., bit lines) in a second plane. Each topological cross-point of a first access line and a second access line may correspond to a memory cell. Hence, a deck of memory cells in a cross-point architecture may include a memory array having a plurality of memory cells placed at topological cross-points of access lines (e.g., a 3D grid structure of access lines). Forming buried access lines as described above may decrease the number of processing steps associated with forming the decks of memory cells, and thus may reduce time and costs associated with the fabrication process.

Features of the disclosure introduced above are further described below in the context of buried lines and related fabrication techniques. Specific examples of structures and techniques for fabricating buried lines are then described. These and other features of the disclosure are further illustrated by and described with reference to apparatus diagrams, method of formation diagrams, and flowcharts that relate to buried lines and related fabrication techniques.

Figure 1B:
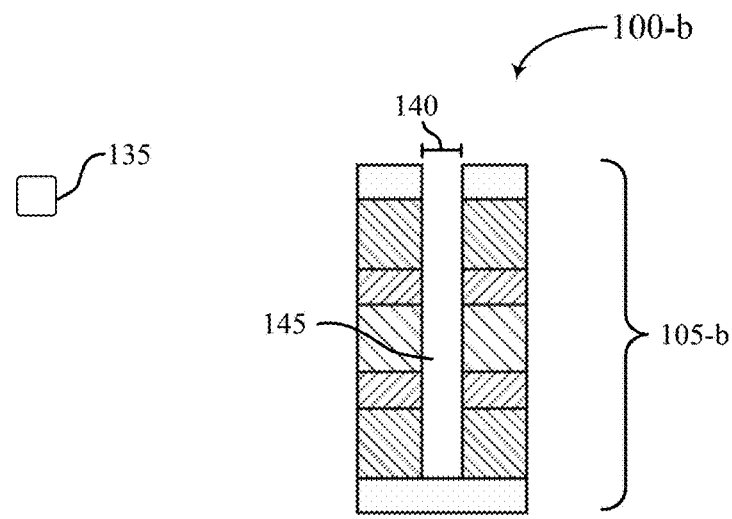
Figure 1C:
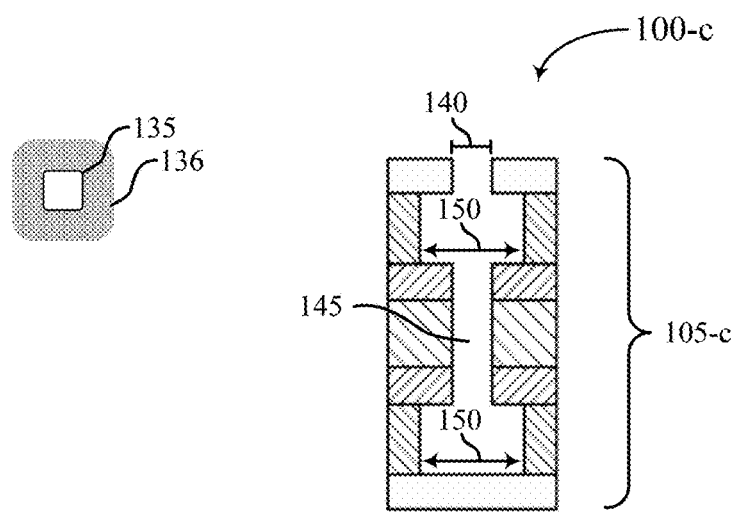

FIGS. 1A through 1C illustrate exemplary fabrication techniques for buried lines in accordance with the present disclosure. FIG. 1A depicts processing step 100-*a*, which may include one or more thin-film deposition or growth steps that form a stack 105-*a*. FIG. 1A illustrates a side view of the stack 105-*a*, which may be an initial stack of layers prior to applying further fabrication techniques as described herein. The stack 105-*a* may be formed above a substrate, and may be referred to as a composite stack that may include a number of different layers of various materials. The materials may be selected, for example, based on a number of factors such as a type of electronic device to be fabricated based on the stack 105-*a*. For example, in the context of a memory device, the materials may be selected based on a utilized type of memory cell (e.g., self-selecting memory, FeRAM, CBRAM, cross-point) or a desired number of decks of memory cells (e.g., two or more decks of memory cells).

In some examples, the stack 105-*a* may include an upper layer 110, which may be a top layer of the stack 105-*a*. Upper layer 110 may include, for example, a dielectric material and/or a hardmask material. In the case that upper layer 110 includes a hardmask material, upper layer 110 may be referred to as hardmask layer 110. In some examples, a first set of vias may be formed in the upper layer 110. The vias may be formed, for example, using a photolithography step that transfers a particular pattern of vias to upper layer 110.

The stack 105-*a* may also include layers 115-*a* and 115-*b*, which may be referred to as first layer 115-*a* and first layer 115-*b*. Though FIG. 1A depicts two first layers 115 (e.g., first layer 115-*a* and first layer 115-*b*), any number of first layers may be included in the stack 105-*a*. In some examples, each of first layer 115-*a* and 115-*b* may include a first dielectric material. As described below with reference to FIGS. 1B and 1C, a channel may be formed in each of the respective first layers (e.g., first layer 115-*a* and first layer 115-*b*) using a set of first vias, and each channel may be subsequently filled with an electrode material (e.g., a conductive material such as copper (Cu), aluminum (Al), gold (Au), tungsten (W), titanium (Ti), carbon (C), metal alloys, conductively-doped semiconductors, or other conductive materials, alloys, or the like). The channels formed in the respective first layers may be formed after forming a first set of vias. In some cases, channels in respective first layers 115 may be formed concurrently—that is, a channel in first layer 115-*a* may be formed concurrently with a channel in first layer 115-*b*.

Filling each channel with an electrode material may, ultimately, result in the formation of a set of first conductive lines. In some cases, first conductive lines may be referred to as buried conductive lines because the first conductive lines are positioned below a top layer (e.g., below layer 110). Buried lines formed at two or more layers—e.g., formed within two or more layers each comprising the first dielectric material—may be formed concurrently in accordance with the fabrication techniques described herein.

Figure 2A:
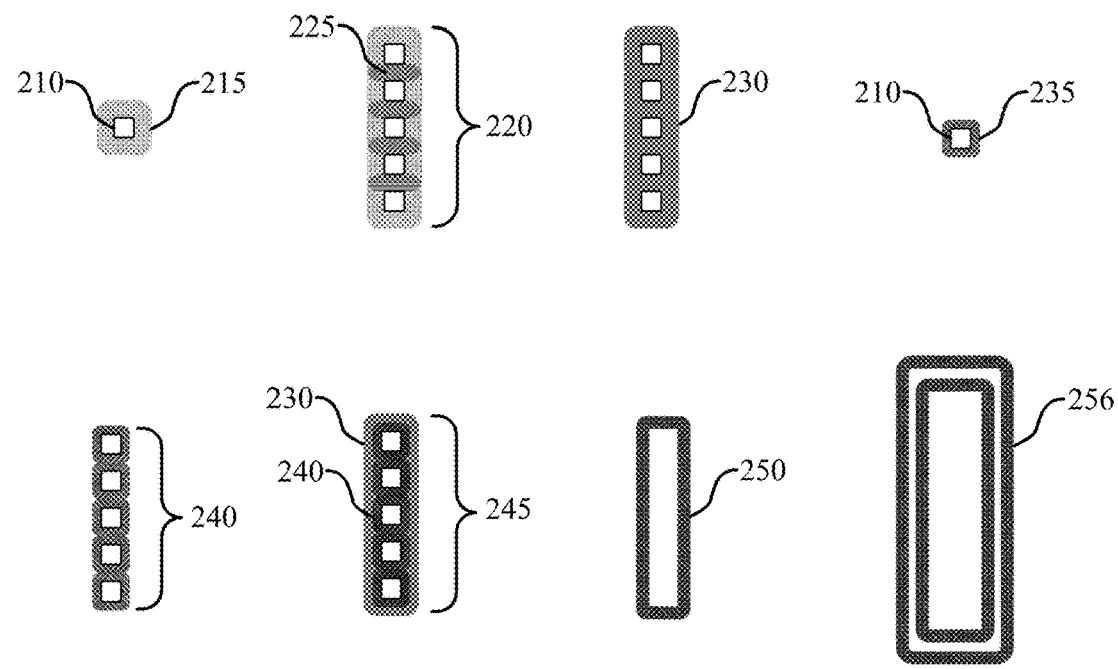
FIGS. 2A and 2B illustrate example fabrication techniques to form buried lines in accordance with examples of the present disclosure.

The stack 105-*a* may include layer 125, which may be referred to as a second layer 125. Though FIG. 2A depicts a single second layer 125, any number of second layers may be included in the stack 105-*a*. In some examples, second layer 125 may include a second dielectric material. The second dielectric material may be a different material as the first dielectric material of first layer 115-*a* and first layer 115-*b*. As described below with reference to FIG. 4, a channel may also be formed in the second layer 125, and may be subsequently filled with an electrode material, which may be a same or different electrode material as that used to fill channels formed in any first layer 115. The channel formed in the second layer 125 may be formed using a set of second vias, which may have a different configuration than the set of first vias.

Filling the channel in the second layer 125 with an electrode material may, ultimately, result in the formation of a second conductive line (or, in examples where the stack 105 comprises multiple second layers 125, a set of second conductive lines, each second conductive line in a respective second layer 125). In some cases, second conductive lines may be referred to as buried conductive lines because the second conductive lines are positioned below a top layer (e.g., below layer 110). Buried lines formed at two or more layers—e.g., formed within two or more second layers each comprising a second dielectric material—may be formed concurrently in accordance with the fabrication techniques described herein.

In some examples, the stack 105-*a* may include layers 120-*a* and 120-*b*, which may be referred to as third layers 120 (e.g., third layer 120-*a* and third layer 120-*b*). Third layers 120-*a*, 120-*b* may separate first layers 115-*a*, 115-*b*. In some examples, each third layer may be or may include a memory material (e.g., a chalcogenide alloy) formed as a part of the stack 105-*a*. In other examples, each third layer may be or may include a placeholder material, which may later be removed (e.g., partially removed or completely removed) and replaced by a memory material (e.g., a chalcogenide alloy). Each third layer may ultimately include one or more memory cells, which may be formed concurrently. In some examples, each third layer may also be or include a dielectric material, or a layer that includes active CMOS devices. The active CMOS devices may be coupled with one another by, for examples, buried lines within first layers 115-*a*, 115-*b* and/or second layer 125. In some examples, each third layer 120-*a* may comprise a buffer material that separates an adjacent first layer 115 from an adjacent second layer 125.

The stack 105-*a* may include a layer 130. In some cases, the layer 130 may include an etch-stop material to withstand various etch processes described herein. The layer 130 may include the same hardmask material as the layer 110 in some cases, or may include a different material. In some cases, the layer 130 may be a substrate or may provide a buffer layer with respect to circuits or other structures formed in a substrate or other layers (not shown), which may be below layer 130. In some examples, layer 130 may be or may be referred to as an etch-stop layer.

FIG. 1B depicts processing step 100-*b*. In some examples, FIG. 1B illustrates a via 135 (e.g., a top view of via 135) and a side view of a stack 105-*b*, which may be an example of stack 105-*a* after processing step 100-*b* has been completed. Processing step 100-*b* may include a photolithography step that transfers a shape of via 135 onto the stack 105-*a*. In some examples, the photolithography step may include forming a photoresist layer (not shown) having a shape of via 135 (e.g., defined by a lack of photoresist material inside of the via 135) on a top layer (e.g., upper layer 110 as described with reference to FIG. 1A). In some examples, an etch processing step (e.g., using the photoresist layer) may transfer the shape of via 135 onto a top layer such that the shape of via 135 established within the top layer may be repeatedly used as an access via during subsequent processing steps—namely, the top layer including the shape of via 335 may function as a hardmask layer providing an access via in the shape of via 135 for the subsequent processing steps.

In some examples, processing step 100-*b* may include an anisotropic etch step to remove one or more materials from the stack 105-*a*. An anisotropic etch step may remove a target material in at least one direction by applying an etchant (e.g., a mixture of one or more chemical elements) to the target material. The etchant may include one or more properties that results in the removal of only the target material (e.g., upper layer 110 as described with reference to FIG. 1A) while preserving other materials (e.g., photoresist) exposed to the etchant. An anisotropic etch step may use one or more etchants during a single processing step when removing one or more layers of materials. In some cases, an anisotropic etch step may use an etchant that includes one or more properties that results in the removal of a group of materials (e.g., oxides and nitrides) while preserving other groups of materials (e.g., metals) exposed to the etchant.

The anisotropic etch step (e.g., a plasma etch) may remove one or more materials based on the shape of via 135, thereby creating a via hole 145 through one or more layers of the stack 105-*a* based on the shape of via 135. For example, the anisotropic etch step may remove one or more materials based on a shape of via 135 formed during a photolithography step as described above. The via 135 may have a width 140 (e.g., a diameter), and the via hole 145 may, in some examples, have a width that corresponds to the width of via 135.

In some examples, stack 105-*b* may include multiple vias 135, and the via 135 may be included in a set of vias. For example, stack 105-*b* may include a plurality of first vias disposed such that the plurality extends in a first direction and, in some examples, may include a second plurality of vias disposed such that the plurality extends in a second direction. Each of the pluralities of vias may be configured in rows; each row may extend in a different direction. For example, a first row of vias may extend in a first direction, and a second row of vias may extend in a second direction to form an "L" shape. Other example configurations of vias are described with respect to FIGS. 2A and 2B.

FIG. 1C depicts processing step 100-*c*. FIG. 1C may depict a top view of a cavity 136 and a side view of stack 105-*c*. In some examples, stack 105-*c* may depict stack 105-*b* (e.g., as described with reference to FIG. 1B) after processing step 100-*c* is complete. Additionally or alternatively, cavity 136 may represent a top view of one or more cavities formed in one or more first layers (e.g., first layer 115-*a*, first layer 115-*b* as described with reference to FIG. 1A) of stack 105-*c*. For example, cavity 136 may share a common center with via 135—e.g., the via 135 and the cavity 136 may be concentric about a vertical axis of the via 135 as illustrated in FIG. 1C, with vertical referring to a direction that extends through the stack 105 and is orthogonal to a substrate underlying the stack 105. The via hole 145 may expose a target material (e.g., a first dielectric material) within one or more target layers (e.g., first layer 115-*a*, first layer 115-*b* as described with reference to FIG. 1A). In some examples, processing step 100-*c* may include an isotropic etch step to produce the cavity 136 within the one or more target layers and formed around the via hole 145.

In some examples, an isotropic etch step may concurrently remove a portion of a first dielectric material from each first layer (e.g., from first layer 115-*a* and from first layer 115-*b* as described with reference to FIG. 1A). The isotropic etch step may preserve (or substantially preserve) other materials in the stack 105-*b* (e.g., at other layers) that are exposed to the etchant. As a result of the isotropic etch step, an outer width (e.g., width 150) of each cavity 136 may be greater than a width (e.g., width 140) of via hole 145. In some examples, via hole 145 may correspond to the diameter of via 135. As such, an outer width of a cavity 136 (e.g., width 150) may be based in part on the width of via 135 and/or an amount of target material removed during processing step 100-*c*. Additionally or alternatively, each cavity 136 may be referred to as a buried cavity 136 due to being formed in one or more buried layers (e.g., first layer 115-*a*, first layer 115-*b* as described with reference to FIG. 1A).

Any number of buried cavities 136 may be formed and, in some examples, may be formed concurrently. For example, a number of buried cavities 136 may be concurrently formed within a stack of layers using processing steps 100-*a* through 100-*c*. The specific number of buried cavities 136 formed may, in some examples, be determined based in part on a number of distinct target layers of the stack (e.g., a number of distinct layers comprising the target material and separated by other layers). The via hole 145 penetrating through the stack may provide access (e.g., a path) for etchants during the isotropic etch step to reach the buried target layers such that the isotropic etch step may remove, in some cases concurrently, a part of each buried target layer through the via hole 145. This process may result in buried cavities at each target layer. Accordingly, in some examples, via 135 may be referred to as an access via 135.

Figure 2B:
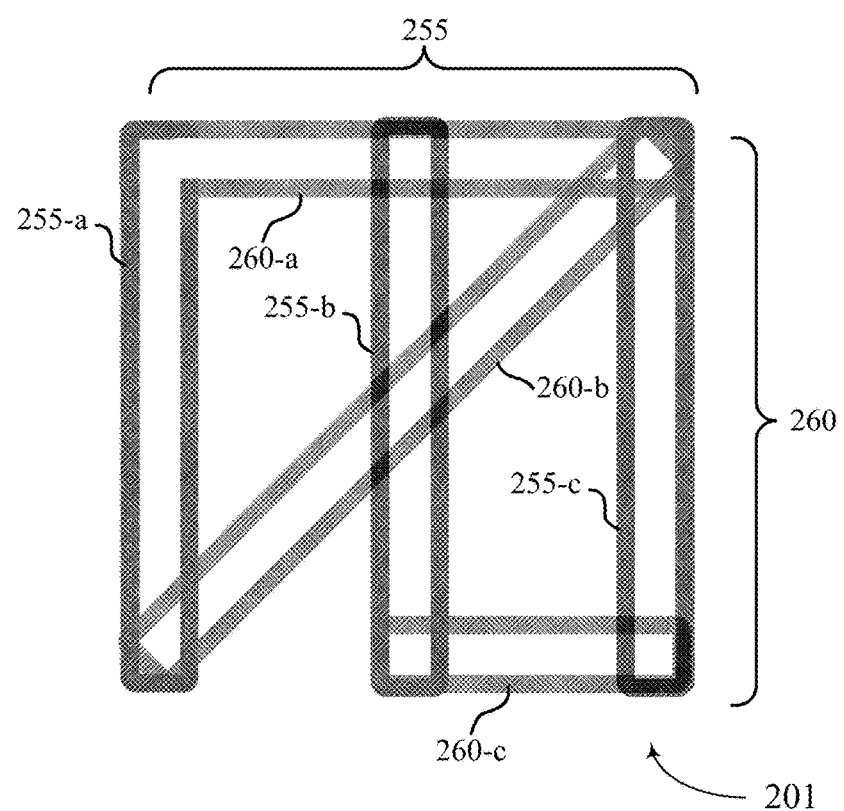

FIGS. 2A and 2B illustrate exemplary via patterns that support buried lines and related fabrication techniques in accordance with the present disclosure, as well as associated structures. FIG. 2A illustrates a via 210 and an associated first cavity 215. Via 210 may be an example of via 135 described with reference to FIGS. 1A through 1C, and first cavity 215 may be an example of a cavity 136 described with reference to FIGS. 1A through 1C. First cavity 215 may represent a cavity (e.g., a buried cavity) concentric about a vertical axis of via 210, and formed in a target material at a buried layer of a stack.

In some examples, FIG. 2A illustrates a first channel 220, which may be formed at the buried layer using a set of multiple vias 210 (e.g., five vias 210 as shown in FIG. 2A). The set of vias may be arranged in a linear pattern or configuration (e.g., a row), as an example. In other examples, the set of vias 210 may be arranged in a non-linear configuration, such as an "L" shape (not shown) or an "S" shape (not shown). A set of first cavities 215, each first cavity 215 corresponding to a via 210, may be formed in the target material at the buried layer. The distance between vias 210 and the amount of target material removed when forming each first cavity 215 may be configured such that adjacent, or contiguous, first cavities 215 may merge to form first channel 220. Stated another way, multiple first cavities 215 may overlap, creating overlap region 225. The overlap regions 225 of adjacent first cavities 215 may merge to form first channel 220. Accordingly, first channel 220 may be aligned with the set of vias 210 (e.g., may intersect a vertical axis of each via 210). In some examples, first channel 220 may have a same or similar width as the width of first cavity 215, and first channel 220 may have a length determined by a number of first cavities 215. For example, first channel 220 may have a greater length if it included five vias as opposed to three vias.

In some examples, FIG. 2A illustrates a filled channel 230. Filled channel 230 may correspond to a first channel 220 after completing at least two subsequent processing steps using the vias 210—e.g., a first processing step of depositing a filler material (e.g., a conductive material) in the first channel 220 and associated vias 210, followed by a second processing step of removing the filler material from the associated vias 210 using an etch process. The etch process may be or may include an anisotropic etch step (e.g., as described with reference to FIGS. 1B and 1C). Stated another way, filled channel 230 may include a filler material in the first channel 220 and, in some cases, may not include the filler material in the via holes associated with vias 210. Although first channel 220 and filled channel 230 are illustrated as having a linear configuration corresponding to the linear configuration of vias 210, first channel 220 and filled channel 230 may be formed in any non-linear shape (e.g., an L-shape, X-shape, T-shape, S-shape, etc.). The shape may be based on the spatial configuration of vias 210. Accordingly, a set of vias 210 may be positioned to define an outline of any intended shape, and the spacing between adjacent vias 210 may be configured such that contiguous cavities formed at the target layer using the vias 210 merge to form a first channel 220 at the target layer. In some examples, filled channel 230 may be a final pattern based on vias 210. If a filled channel 230 is formed at each of multiple layers using a common set of vias 210 (e.g., simultaneously), then the vias 210 used to form the multiple filled channels 230 may be filled with a dielectric material to electrically isolate the vertically stacked filled channels 230 from one another. Thus, filled channels 230 formed simultaneously at multiple layers of a stack using a common set of vias 210 may be configured as separate electrodes, each having the width of filled channel 230 and a ladder-like shape.

In some examples, FIG. 2A illustrates via 210 and an associated second cavity 235. Second cavity 235 may be an example of a cavity 136 described with reference to FIG. 1C. In some examples, a width of second cavity 235 may be less than a width of first cavity 215. As described above, a size of a cavity associated with a via 210 may vary depending on the width of the via 210 and/or an amount of target material removed during an isotropic etch step. In some examples, second cavity 235 may represent a cavity (e.g., a buried cavity) concentric about a vertical axis of via 210 and formed in a target material at a buried layer of a stack (e.g., stack 105-c as described with reference to FIG. 1C). The target material may be the filler material described in reference to filled channel 230, and thus second cavity 235 may be a cavity within the filler material formed by removing (e.g., through isotropic etching) a portion of the filler material from filled channel 230 at the target layer.

In some examples, FIG. 2A illustrates a second channel 240 formed at a buried layer using multiple vias 210. For example, the second channel 240 may include five vias 210, which may be arranged in a linear configuration. A second cavity 235 corresponding to each via 210 may be formed in the target material at the buried layer. The distance between vias 210 and the amount of target material removed when forming each second cavity 235 may be configured such that adjacent, or contiguous, second cavities 235 may merge to form second channel 240. Accordingly, second channel 240 may be aligned with the set of vias 210 (e.g., may intersect a vertical axis of each via 210). In some examples, second channel 240 may have a same width as a width of second cavity 235. Additionally or alternatively, second channel 240 may have a length determined by a number of second cavities 235, and thus by a number of vias 210 used to create second channel 240.

In some examples, FIG. 2A illustrates an intermediate pattern 245, which may correspond to a second channel 240 formed within filled channel 230. The intermediate pattern 245 may illustrate a result of one or more process steps in which a portion of the filler material is removed to form second channel 240 within the filled channel 230. Second channel 240 may be formed using similar techniques as those described for filled channel 230, using the same set of vias 210, but with a different width. In some examples, filler material within filled channel 230 may include the target material during the formation of second channel 240. Thus, a second channel 240 may be narrower than a first channel 220 (due to cavities 235 having a width less than a width of cavities 215) and may be formed within a filled channel 230, and each of first channel 220, filled channel 230, and second channel 240 may be formed using a single set of vias 210. Because a width of second channel 240 may be less than width of the filled channel 230, a portion of the filler material within the filled channel 230 may remain along the outer boundary of filled channel 230, thus surrounding second channel 240. Accordingly, a portion (e.g., a loop, band, ring, or racetrack) of filler material may remain at the target layer. In some examples, the portion may be elongated, having a length larger than a width.

In some examples, FIG. 2A illustrates loop 250, which may correspond to an end result of the intermediate pattern 245. For example, loop 250 may result from the formation of second channel 240 within the filled channel 230. In some examples, second channel 240 may be filled with a dielectric material, and thus loop 250 may surround a segment (e.g., a filled channel narrower than first channel 220 or filled channel 230, with width instead corresponding to the width of second channel 240) of filler material (e.g., a material with which first channel 220 was filled to create filled channel 230). In some cases, the dielectric material surrounded by loop 250 may be the same material as the target material comprising the target layer at which first channel 220 was formed (e.g., a dielectric material), or may be a different dielectric material. Additionally or alternatively, the filler material may be or may include a conductive material, which may be the same as the material included in loop 250, which may form a single buried line (e.g., electrode) having a width equal to the width of first channel 220. In other examples channels may be formed at multiple layers (e.g., of a stack 105-a as described with reference to FIG. 1A). In some such examples, utilizing a conductive material as the filler material may couple electrodes that are formed at each layer.

In some examples, two concentric loops 256 (e.g., loop 250 plus a second loop) may be formed by forming a second loop within loop 250 using the same vias 210. For example, a second loop within loop 250 may be formed by repeating the techniques used to form loop 250, but with narrower cavity and thus channel widths. For example, a third channel may be formed within the dielectric material surrounded by loop 250. The third channel may be narrower than the second channel 240, and thus a loop of the dielectric material may remain around the third channel, the loop of the dielectric material itself surrounded by loop 250. In some examples, the third channel may be filled with electrode material and, subsequently, a fourth channel may be formed within the electrode material and filled with a dielectric material. The fourth channel may be narrower than the third channel. Accordingly, the fourth channel may be filed with the first dielectric material, such that two concentric loops 256 of electrode material are formed, separated by a dielectric material used to fill loop 250. It is to be understood that any number of concentric loops 256 (that is, two or more than two) may be formed using the same set of vias 210 by repeatedly forming loops 250 within any number of previously formed loops 250.

As described above, FIG. 2A illustrates the successive formation of five cavities 215. However, in other examples, the channels formed by the processes described above may be formed using any number of vias 210. Additionally or alternatively, although FIG. 2A illustrates the formation of channels and loops at a same layer of a stack (e.g., at first layer 115-a, 115-b as described with reference to FIG. 1A), in other examples, the channels and loops formed by the processes described above may be formed at any number of target layers, and may be concurrently formed in target layers comprising a same target material. Such processes may result in one or more loops (e.g., loop 250 and/or loop 256) at each target layer in the stack.

FIG. 2B illustrates a diagram 201, which illustrates a top view of a first plurality of loops 255 (e.g., loops 255-*a* through 255-*c*) extending in a first direction (e.g., an x-direction), and a second plurality of loops 260 (e.g., loops 260-*a* through 260-*c*) extending in a second direction (e.g., a y-direction) or a third direction. In some examples, the third direction may be an angular direction (e.g., not orthogonal to either the x-direction or the y-direction). Each loop of the first plurality of loops 255 and the second plurality of loops 260 may be an example of a loop 250.

In some examples, the combination of loops 255 and loops 260 may be formed by a same or different pattern of vias. In some examples, a combination of loops 255 and/or 260 may be formed at a same layer (e.g., first layer 115-*a*, 115-*b* as described with reference to FIG. 1) using at least one common via (or using multiple vias spaced at a distance less than a width of the channel formed). In such an example, the combination of loops 255 and/or loops 260 may be referred to as conjoined loops, as a loop 255 may be electrically coupled with a loop 260. For example, loop 255-*a* and loop 260-*c* may be formed at a same layer using at least one common via. Accordingly, loop 255-*b* and loop 260-*a* may be conjoined loops that are formed in a "T" shape. The shape may be formed, for example, by forming an extension of a first channel as described with reference to FIG. 2A. Subsequent channels may be formed in the extensions to form one or more loops (e.g., loop 250, 256 as described with reference to FIG. 2A). As used herein, an extension may refer to a branch-like structure of intersecting loops 255 or 260 (or filled channels 230), whether formed simultaneously or at different points in time.

In another example, loop 255-*b* and loop 260-*c* may be formed using a common via but at different layers (e.g., first layer 115-*a*, 115-*b* and second layer 125 as described with reference to FIG. 1A). In yet another example, loop 255-*a* and loop 260-*a* may be formed at a same layer using a common via (e.g., first layer 115-*a*, 115-*b* as described with reference to FIG. 1A), as indicated by a partial absence of conductive material at the intersection of loop 255-*a* and loop 260-*a*. Thus, any combination of loops 255 and loops 260 illustrated in FIG. 2B may represent conjoined loops formed at a same layer using at least one common via, or individual (that is electrically isolated from one another) loops formed at different layers. Loops 255, 260 formed at different layers may be electrically isolated from one another, or may be coupled to one another by filling a common via associated with multiple of the loops 255, 260 with conductive material.

In some examples, the plurality of loops 255 and/or 260 may exist in one or more first layers (e.g., first layers 115-*a*, 115-*b* as described above with reference to FIG. 1A). Accordingly, the result may be one or more conjoined loops (e.g., loops formed in a "T," "X," "L," etc. shape). In other examples, the plurality of loops 255 and/or 260 may exist in one or more second layers (e.g., second layers 125 as described above with reference to FIG. 1A). Additionally or alternatively, any combination of loops 255 and/or 260 may exist in a combination of one or more first and second layers. For example, if the first plurality of loops 255 are located in one or more first layers, and the second plurality of loops 260 are located in one or more second layers, the first plurality of loops 255 and the second plurality of loops 260 may form a matrix of buried lines (e.g., a grid structure of access lines) in a 3D cross-point configuration. In the example of a memory device, each topological cross-point of buried lines may correspond to a memory cell, and in some cases the memory cell may be interposed between the crossing buried lines.

Loops 255 and/or 260 may in some cases be severed (e.g., divided, separated) into multiple discrete segments, each segment comprising a conductive line. For example, a via 235 used to form a loop 250 may be used to istropically etch (possibly using multiple etchants) through the loop 250 by creating a cavity that extends through and thus severs the loop 250. As another example, a via 235 positioned above the conductive material of a loop 250 may be used to anistropically etch (possibly using multiple etchants) through the loop 250. As another example, a set of vias 210 may be used to create a channel 220 that intersects and thus severs the loop 250.

It is to be understood that any number and any arrangement of loops 255, 260 may be formed using the techniques described herein, and any of the loops 255, 260 may be conjoined with one another or electrically isolated from one another. Further, though not shown in the example illustrated in FIG. 2B, it is to be understood that each loop of the first plurality of loops 255 and the second plurality of loops 260 may in some cases surround or be surrounded by one or more other loops and thus be part of a set of concentric loops 256. Also, though the example illustrated in FIG. 2B comprises loops 255, 260 that are examples of loops 250 as described in reference to FIG. 2A, it is to be understood that similar arrangements of filled channels 230 or other structures illustrated in FIG. 2A may be fabricated using the techniques described herein.

Additionally or alternatively, the arrangement of loops 255, 260 may be based in part on an initial via pattern spacing and/or material selection at each individual layer (e.g., at first layer and at second layer). For example, loop 255-*a* may be formed at a first layer and loop 260-*b* may be formed at a second layer. As an initial step, individual vias may be patterned according to the structures to be formed at each of the first layer and second layer. To ensure that structure at the second layer (e.g., loop 260-*b*) is not affected (e.g., severed) by the process steps used to create a structure at the first layer (e.g., loop 255-*a*), the vias used to form the structure at the first layer may be sized and located so as to avoid impacting the structure already formed or to be formed at the second layer. Stated another way, the spacing and sizing of the vias used to form structures at one layer may ensure that residual dielectric material remains at another layer to preserve or allow for the subsequent formation of structures at the another layer. In some examples, residual dielectric material may remain at the another layer due to different layers comprising different dielectric materials. In some examples, buried conductive lines may be formed at multiple layers (e.g., at first layer, at second layer). A width of the buried conductive lines at a respective layer (e.g., at a first layer) may be based on a width of the cavity formed to create the buried conductive line.

Figure 3:
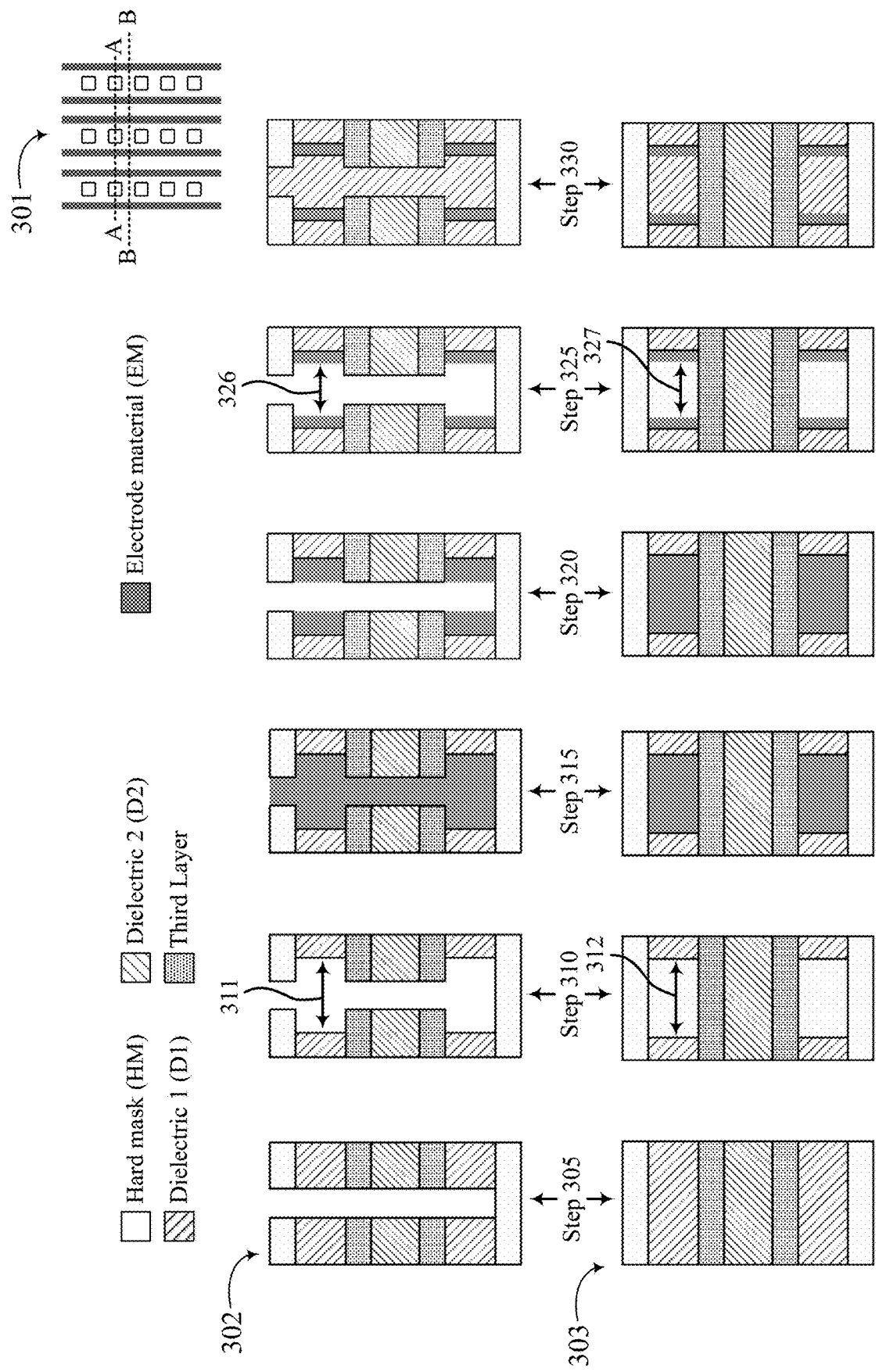
FIGS. 3 through 5 illustrate example fabrication techniques to form buried lines in accordance with examples of the present disclosure.

FIG. 3 illustrates example methods of forming buried lines in accordance with fabrication techniques of the present disclosure. In some examples, FIG. 3 depicts the concurrent formation of two sets of buried lines, with each set of buried lines at a respective first layer comprising a first dielectric material, which may be referred to as a D1 layer. In some examples, buried lines may be or may refer to one or more electrodes, circuit traces, interconnects between various electronic components, or may be a part of or associated with a data bus. Additionally or alternatively, buried lines may refer to access lines (e.g., bit lines and/or word lines) of a memory device, including a 3D memory device such as a 3D cross-point memory device.

The stack of layers shown in FIG. 3 may correspond to stack 105-*a* as described with reference to FIG. 1A. For example, a hardmask (HM) layer may correspond to upper layer 110, a first dielectric layer (e.g., a "D1" layer) may correspond to first layers 115-*a* and 115-*b*, a second dielectric layer (e.g., a "D2" layer) may correspond to layer 125, and a third layer may correspond to third layers 120-*a* 120-*b*, as described with reference to FIG. 1A.

FIG. 3 depicts diagrams 301, 302, and 303. In some examples, diagram 301 may depict a top view of a stack that includes three rows of vias (e.g., vias 210 as described with reference to FIG. 2A) and six buried lines (e.g., word lines) formed using the rows of vias. Each row of vias in diagram 301 may be used to form at least one loop (e.g., a loop 250 or concentric loops 256 as described with reference to FIG. 2A) at a target layer.

In some examples, diagram 302 may depict a cross-sectional side view of the stack (e.g., stack 105-*a* as described with reference to FIG. 1A). The cross-sectional side views may correspond to a center of a via shown in diagram 301, denoted by reference line A-A. Additionally or alternatively, diagram 303 may illustrate a cross-sectional side view of the stack (e.g., stack 105-*a* as described with reference to FIG. 1A) corresponding to a space between the vias of diagram 301, as denoted by reference line B-B.

At processing step 305, a photolithography step may transfer the pattern of vias illustrated in diagram 301 onto the stack of materials. An anisotropic etch step may subsequently remove one or more materials from the stack to create via holes that penetrate the stack. As described above, a via may penetrate a top layer (e.g., upper layer 110 as described with reference to FIG. 1A) and a via hole may extend into the stack (e.g., to first layer 115-*a*, 115-*b* as described with reference to FIG. 1A).

In diagram 302, processing step 305 may depict one via (e.g., a first via or a first hole) and a corresponding via hole that penetrates the stack. In other examples (not shown), processing step 305 may include forming a plurality of vias (e.g., a plurality of first vias or a plurality of first holes). This process may expose buried layers of the stack to subsequent processing steps. In diagram 303, processing step 305 may depict that the initial stack (e.g., stack 105-*a* as described with reference to FIG. 1A) remains intact between adjacent vias. Stated another way, diagram 303 may depict that the portion of the stack between adjacent vias may remain unchanged during processing step 305. In some examples, processing step 305 may be an example of processing step 100-*b* as described with reference to FIG. 1B.

At processing step 310, an isotropic etch step may selectively remove at least a portion of the dielectric material at each first layer (e.g., first layer 115-*a*, 115-*b* as described with reference to FIG. 1A) in the stack. For example, the isotropic etch step may selectively remove a portion of each first layer (e.g., each D1 layer) that is exposed to an etchant of the isotropic etch. In some examples, the etchant used at processing step 310 may exhibit a selectivity with respect to other materials of the stack (e.g., materials at other layers of the stack). Stated another way, the etchant may selectively remove at least a portion of the first dielectric material at each D1 layer while preserving (e.g., substantially preserving or entirely preserving) other materials (e.g., materials at other layers, such as the DM layer, D2 layer, HM layer) of the stack.

By selectively removing, using multiple adjacent vias, at least a portion of the first dielectric material from each first layer, processing step 310 may result in a first channel formed at each first layer. The first channel may be formed by removing, through the via formed at processing step 305, as well as other continuous vias of a set of vias that includes the via formed at processing step 305, a portion of the first dielectric material from the respective first layers. By removing a portion of the first dielectric material, a corresponding set of set of first cavities (e.g., cavities 136 as described with reference to FIG. 1C) may be formed in the first dielectric material at each first layers, and the first cavities may be configured (e.g., located and sized) such that contiguous first cavities may merge to form a first channel at the layer that includes the first cavities. In some examples, the channel may be aligned with a set of vias that includes the via formed at processing step 305 (e.g., the channel may intersect a vertical axis of each via included in the set of vias). Because the via hole exposes sidewalls of each first layer in the stack, the isotropic etch may concurrently create channels at each first layer in the stack. Accordingly, at processing step 310 a first channel may be formed in the first layers.

In some examples, channels may be created at each first layer while the width of the via hole at other layers remains intact (e.g., due to chemical selectivity of an etchant used to create the first cavities and thus the channel). For example, width 311 may be referred to as a first width and may represent a final size of the cavities formed in both first layers. Processing step 310 of diagram 303 may depict that, in some examples, cavities formed at the same layer using adjacent vias may merge, forming a channel (e.g., first channel 220 described with reference to FIG. 2A) at both first layers. The channels may be formed due to the isotropic etch step expanding the size of each cavity in multiple directions. The width of the channel (e.g., width 312) may be associated with one or more overlap regions (e.g., overlap regions 225 as described with reference to FIG. 2A). In some examples, width 312 may be a same as width (or approximately a same width) as width 311. In other examples, width 312 may be less than width 311.

At processing step 315, each channel may be filled with an electrode material. In some examples, the electrode material may be a conductive material. In some cases, excess electrode material may be formed on top of the stack (e.g., on top of HM layer) and may be removed by an etch-back process or chemical-mechanical polishing process. At processing step 315, diagram 303 depicts that the electrode material may flow into the portions of channels between vias, thus concurrently filling each channel. As used herein, via holes filled with a material (e.g., a conductive material) may be referred as holes after having been filled with the material.

At processing step 320, an anisotropic etch step may remove at least a portion of the electrode material. This removal may create new via holes associated with each via. For example, a via hole may be formed at processing step 305 but later filled-in (e.g., by electrode material) at processing step 315. Accordingly a new via hole (e.g., via) may be formed at processing step 320 by removing from the via hole the material with which the via hole and associated channels were filled at processing step 315. The anisotropic etch may use the same via pattern of the HM layer as processing step 305, and may create via holes that expose a sidewall of the electrode material at each first layer. If, after processing step 320, the via holes are filled with a dielectric material (not shown), a set of filled channels 230 as described above in reference to FIG. 2A would exist at each D1 layer.

At processing step 325, an isotropic etch step may selectively remove at least a portion of the electrode material from each first layer. For example, the isotropic etch step may remove a portion of the electrode material previously filled into the cavities at processing step 315. Accordingly, contiguous cavities may be formed at each first layer. The contiguous cavities may merge to form a channel (e.g., a second channel). For example, the channel formed at processing step 310 may be referred to as a first channel and the channel formed at processing step 325 may be referred to as a second channel. At processing step 425, diagram 303 depicts cavities formed at both D1 layers. The second channel may form, in some examples, due to the isotropic etch expanding the size of each cavity in multiple directions. The width of the channel (e.g., width 327) may be associated with one or more overlap regions (e.g., overlap regions 225 as described with reference to FIG. 2A). In some examples, width 327 may be a same as width (or approximately a same width) as width 326. In other examples, width 327 may be less than width 326.

Removal of the electrode material may result in a loop of remaining electrode material (e.g., a loop 250) that surrounds the second channel, and the loop may be subsequently severed such that the two elongated sides (e.g., relatively longer sides) of the loop are configured as two distinct electrodes (e.g., a first electrode and a second electrode). Stated another way, removal of the electrode material may split a first electrode formed in each D1 layer into a respective first pair of electrodes. The two electrodes may be separated by a first distance 326 that is less than the first width 311, where width 326 is the width of a second cavity formed at processing step 325.

The etchant used at processing step 325 may exhibit a selectivity with respect to other materials (e.g., materials at other layers of the stack). For example, the etchant may remove the a portion of the electrode material while preserving (or substantially preserving) other materials (e.g., materials at other layers, such as the DM layer, D2 layer, or HM layer) of the stack. Selective removal of the electrode material from the D1 layers may result in a portion of the electrode material deposited at processing step 315 remaining in the channel formed at processing step 310. This removal may result in the formation of a loop of electrode material (e.g., a loop 250 as described with reference to FIG. 2A).

At processing step 330, each channel and associated via hole may be filled with a dielectric material. The dielectric material may be a same material the same as the dielectric material at each first layer (e.g., a first dielectric material), or may be a different dielectric material. In some examples, at processing step 330, diagrams 302 and 303 may depict that two loops of electrode material (e.g., two loops 250 as described with reference to FIG. 2A) have been concurrently formed using a same row of vias. This may form a first loop at a the upper D1 layer (e.g., first layer 115-*a* as described with reference to FIG. 1A) and a second loop at the lower D1 layer (e.g., first layer 115-*b* as described with reference to FIG. 1A). In other examples, the stack may include any number of D1 layers, each D1 layer having a respective loop of electrode material. Each loop may be formed using the processing steps described above. As used herein, via holes filled with a material (e.g., a dielectric material) may be referred as holes after having been filled with the material.

In some cases, a loop may function as a buried line. In other cases, a loop may be severed (e.g. divided, separated) into multiple segments, thereby forming multiple buried lines from a single loop. For example, if the relatively short sides (e.g., the ends) of an elongated loop are severed from the relatively long sides of the elongated loop, two buried lines may be formed from each loop. A loop may be severed any number of times to create any number of segments and thus any number of discrete buried lines. A loop may be severed for example, by using a via positioned so as to be above the loop to etch (e.g., anisotropically etch) through the loop. A loop may also be severed by using a via positioned near the loop, such as one of the vias used to create the loop, to create at the layer that includes the loop a cavity with a width that is greater than the outer width of the loop (e.g., by using one or more isotropic etch steps to remove material surrounded by the loop as well as material included in the loop until the loop has been severed). As yet another example, a loop may be severed by using a second set of vias (where a first set of vias is used to create the loop), the second set of vias arranged in a configuration (e.g., a linear configuration, such as a row) such that a channel (e.g., a first channel 220) formed at the layer that includes the loop using the second set of vias may intersect and sever the loop. Thus, in some examples, each layer may include one or more conductive lines (e.g., formed by severing one or more loops).

Figure 4:
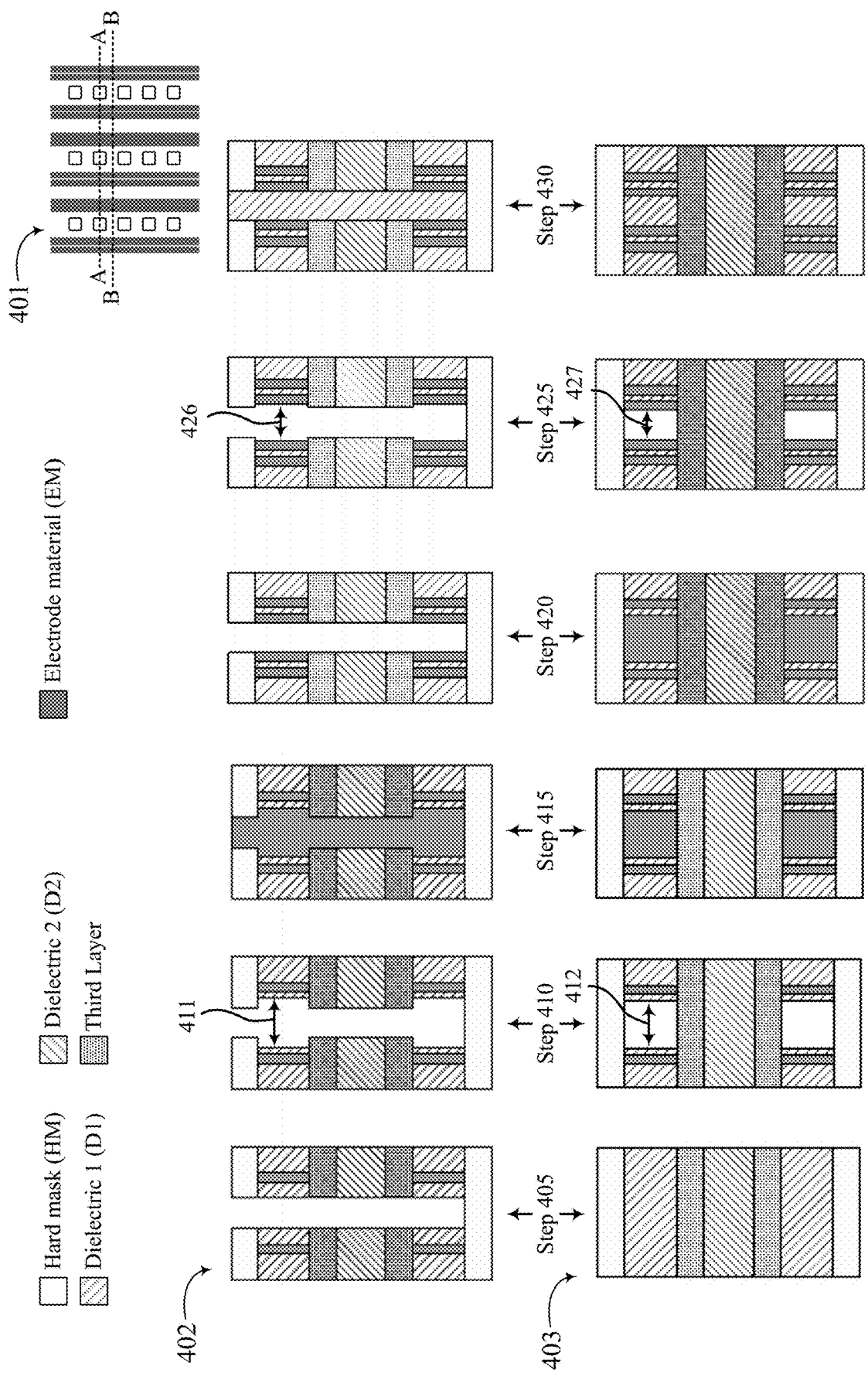

FIG. 4 illustrates example methods of forming buried lines in accordance with fabrication techniques of the present disclosure. In some examples, FIG. 4 depicts the concurrent formation of multiple sets of buried lines, with each set of buried lines at a respective first layer comprising a first dielectric material, which may be referred to as a D1 layer. The stack of layers shown in FIG. 4 may correspond to stack 105-*a* as described with reference to FIG. 1A. For example, a hardmask (HM) layer may correspond to upper layer 110, a first dielectric layer (e.g., a "D1" layer) may correspond to first layers 115-*a* and 115-*b*, a second dielectric layer (e.g., a "D2" layer) may correspond to layer 125, and a third layer may correspond to third layers 120-*a* 120-*b*, as described with reference to FIG. 1A.

FIG. 4 depicts diagrams 401, 402, and 403. In some examples, diagram 401 may depict a top view of a stack that includes three rows of vias (e.g., vias 210 as described with reference to FIG. 2A) and six buried lines (e.g., word lines) formed using the rows of vias. Each row of vias in diagram 401 may be used to form at least one loop (e.g., a loop 250 or concentric loops 256 as described with reference to FIG. 2A) at a target layer.

In some examples, diagram 402 may depict a cross-sectional side view of the stack (e.g., stack 105-*a* as described with reference to FIG. 1A). The cross-sectional side views may correspond to a center of a via shown in diagram 401, denoted by reference line A-A. Additionally or alternatively, diagram 403 may illustrate a cross-sectional side view of the stack (e.g., stack 105-*a* as described with reference to FIG. 1A) corresponding to a space between the vias of diagram 301, as denoted by reference line B-B.

At processing step 405, an anisotropic etch step may subsequently remove one or more materials from the stack to create via holes that penetrate the stack. As described above, a via may penetrate a top layer (e.g., upper layer 110 as described with reference to FIG. 1A) and a via hole may extend into the stack (e.g., to first layer 115-*a*, 115-*b* as described with reference to FIG. 1A). Or, in other examples, a via may extend through both the top layer and into the stack. In either example, the terms via, via hole, and hole may be used interchangeably and may refer to the cavity created during processing step 405.

In diagram 402, processing step 405 may be performed upon a stack of materials that has been processed as described in reference to FIG. 3. Thus, the stack of materials may include two loops of electrode material formed in processing step 330 as described with reference to FIG. 3. At processing step 405, an anisotropic etch step may remove one or more materials, using the same vias described in reference to FIG. 3, to create new via holes that penetrate the stack. The new via holes created at processing step 405 may expose buried layers of the stack to subsequent processing steps. In diagram 403, processing step 405 may depict that the initial stack (e.g., stack 105-a as described with reference to FIG. 1A) remains intact between adjacent vias. Stated another way, diagram 403 may depict that the portion of the stack between adjacent vias may remain unchanged during processing step 405. In some examples, processing step 405 may be an example of processing step 100-b as described with reference to FIG. 1B.

At processing step 410, an isotropic etch step may selectively remove at least a portion of the dielectric material at each first layer (e.g., first layer 115-a, 115-b as described with reference to FIG. 1A) deposited at, for example, processing step 330 as described with reference to FIG. 3. For example, the isotropic etch step may selectively remove a portion of each first layer (e.g., each D1 layer) that is exposed to an etchant of the isotropic etch. In some examples, the etchant used at processing step 410 may exhibit a selectivity with respect to other materials of the stack (e.g., materials at other layers of the stack). Stated another way, the etchant may selectively remove at least a portion of the first dielectric material at each D1 layer while preserving (e.g., substantially preserving or entirely preserving) other materials (e.g., electrode material deposited at processing step 315 as described with reference to FIG. 3) of the stack.

By selectively removing, using multiple adjacent vias, at least a portion of the first dielectric material from each first layer, processing step 410 may result in a channel (e.g., a third channel) formed at each first layer. The third channel may be formed by removing, through the via formed at processing step 405, as well as other continuous vias of a set of vias that includes the via formed at processing step 405, a portion of the first dielectric material from the respective first layers. By removing a portion of the first dielectric material, a corresponding set of third cavities (e.g., cavities 136 as described with reference to FIG. 1C) may be formed in the first dielectric material at each first layer, and the third cavities may be configured (e.g., located and sized) such that contiguous third cavities may merge to form a third channel at the layer that includes the third cavities. In some examples, the third channel may be aligned with a set of vias that includes the via formed at processing step 405 (e.g., the channel may intersect a vertical axis of each via included in the set of vias). Because the via hole exposes sidewalls of each first layer in the stack, the isotropic etch may concurrently create third channels at each first layer in the stack. Accordingly, at processing step 410 a third channel may be formed in the first layers.

In some examples, third channels may be created at each first layer while the width of the via hole at other layers remains intact (e.g., due to chemical selectivity of an etchance used to create the third cavities and thus the third channel). For example, width 411 may be referred to as a third width and may represent a final size of the cavities formed in both first layers. Processing step 410 of diagram 403 may depict that, in some examples, cavities formed at the same layer using adjacent vias may merge, forming a third channel at both first layers. The third channels may be formed due to the isotropic etch step expanding the size of each cavity in multiple directions. The width of the third channel (e.g., width 412) may be associated with one or more overlap regions (e.g., overlap regions 225 as described with reference to FIG. 2A). In some examples, width 412 may be a same as width (or approximately a same width) as width 411. In other examples, width 412 may be less than width 411.

At processing step 415, each third channel may be filled with an electrode material. In some examples, the electrode material may be a conductive material. In some cases, excess electrode material may be formed on top of the stack (e.g., on top of HM layer) and may be removed by an etch-back process or chemical-mechanical polishing process. At processing step 415, diagram 403 depicts that the electrode material may flow into the portions of the channels between vias, thus concurrently filling each third channel. As used herein, via holes filled with a material (e.g., a conductive material) may be referred as holes after having been filled with the material.

At processing step 420, an anisotropic etch step may remove at least a portion of the electrode material. This removal may create new via holes associated with each via. For example, a via hole may be formed at processing step 405 but later filled-in (e.g., by electrode material) at processing step 415. Accordingly a new via hole may be formed at processing step 420 by removing from the via hole the material with which the via hole and associated channels were filled at processing step 415. The anisotropic etch may use the same via pattern of the HM layer as processing step 405, and may create via holes that expose a sidewall of the electrode material at each first layer.

At processing step 425, an isotropic etch step may selectively remove at least a portion of the electrode material from each first layer. For example, the isotropic etch step may remove a portion of the electrode material previously filled into the cavities at processing step 415. Accordingly, contiguous cavities may be formed at each first layer. The contiguous cavities (fourth cavities) may merge to form a channel (e.g., a fourth channel). For example, the channel formed at processing step 410 may be referred to as a third channel and the channel formed at processing step 425 may be referred to as a fourth channel. At processing step 425, diagram 403 depicts fourth cavities formed at both D1 layers. The third channel may form, in some examples, due to the isotropic etch expanding the size of each fourth cavity in multiple directions. The width of the channel (e.g., width 427) may be associated with one or more overlap regions (e.g., overlap regions 225 as described with reference to FIG. 2A). In some examples, width 427 may be a same as width (or approximately a same width) as width 426. In other examples, width 427 may be less than width 426.

Removal of the electrode material may result in a loop of remaining electrode material (e.g., an inner loop of a set of two concentric loops 256 as described with reference to FIG. 2A) that surrounds the fourth channel, and the loop may be subsequently severed such that the four elongated sides (e.g., relatively longer sides) of the loops are configured as four distinct electrodes (e.g., a first electrode, a second electrode, a third electrode and a fourth electrode). Stated another way, removal of the electrode material may split a second electrode formed in each D1 layer (e.g., at step 415) into a respective pair of second electrodes. The pairs of electrodes may be separated by varying distances. For example, the pair of electrodes may be separated by a distance greater or less than width 426, where width 426 is the width of a fourth cavity formed at processing step 425.

The etchant used at processing step 425 may exhibit a selectivity with respect to other materials (e.g., materials at other layers of the stack). For example, the etchant may remove the a portion of the electrode material while preserving (or substantially preserving) other materials (e.g., materials at other layers, such as the DM layer, D2 layer, or HM layer) of the stack. Selective removal of the electrode material from the D1 layers may result in a portion of the electrode material deposited at processing step 415 remaining in the third channel formed at processing step 410. This removal may result in the formation of a loop of electrode material (e.g., a loop 256 as described with reference to FIG. 2A).

At processing step 430, each fourth channel and associated via hole may be filled with a dielectric material. The dielectric material may be a same material the same as the dielectric material at each first layer (e.g., a first dielectric material), or may be a different dielectric material. In some examples, at processing step 430, diagrams 402 and 403 may depict that two loops of electrode material (e.g., loops 256 as described with reference to FIG. 2A) have been concurrently formed in each D1 layer using a same row of vias. This may form a first set of concentric loops at the upper D1 layer (e.g., first layer 115-a as described with reference to FIG. 1A) and a second set of concentric loops at the lower D1 layer (e.g., first layer 115-b as described with reference to FIG. 1A). In other examples, the stack may include any number of D1 layers, each D1 layer having a respective set of concentric loops of electrode material. Each loop may be formed using the processing steps described above. In some cases, the concentric loops may function as buried lines. In other cases, one or both loops may be severed (e.g. divided, separated) into multiple segments, thereby forming multiple buried lines from a single loop. For example, if the relatively short sides (e.g., the ends) of an elongated loop are severed from the relatively long sides of the elongated loop, two buried lines may be formed from each loop. Accordingly, severing the concentric loops may form at least four buried lines. A loop may be severed any number of times to create any number of segments and thus any number of discrete buried lines. As used herein, via holes filled with a material (e.g., a dielectric material) may be referred as holes after having been filled with the material.

As shown in FIG. 4, after processing step 430, the separation distance between electrodes formed from concentric loops may be non-uniform. For example, in some cases, an electrode formed from an inner loop may be closer to an electrode formed from an outer loop than to another electrode formed from the inner loop. In other cases (not shown), an electrode formed from an inner loop may be further from an electrode formed from an outer loop than from another electrode formed from the inner loop.

Though FIGS. 3 and 4 collectively illustrate example techniques for the formation of a set of two concentric loops, it is to be understood that like techniques may be repeated any number of times with any channel and loop dimensions in order to form other numbers of concentric loops.

Figure 5:
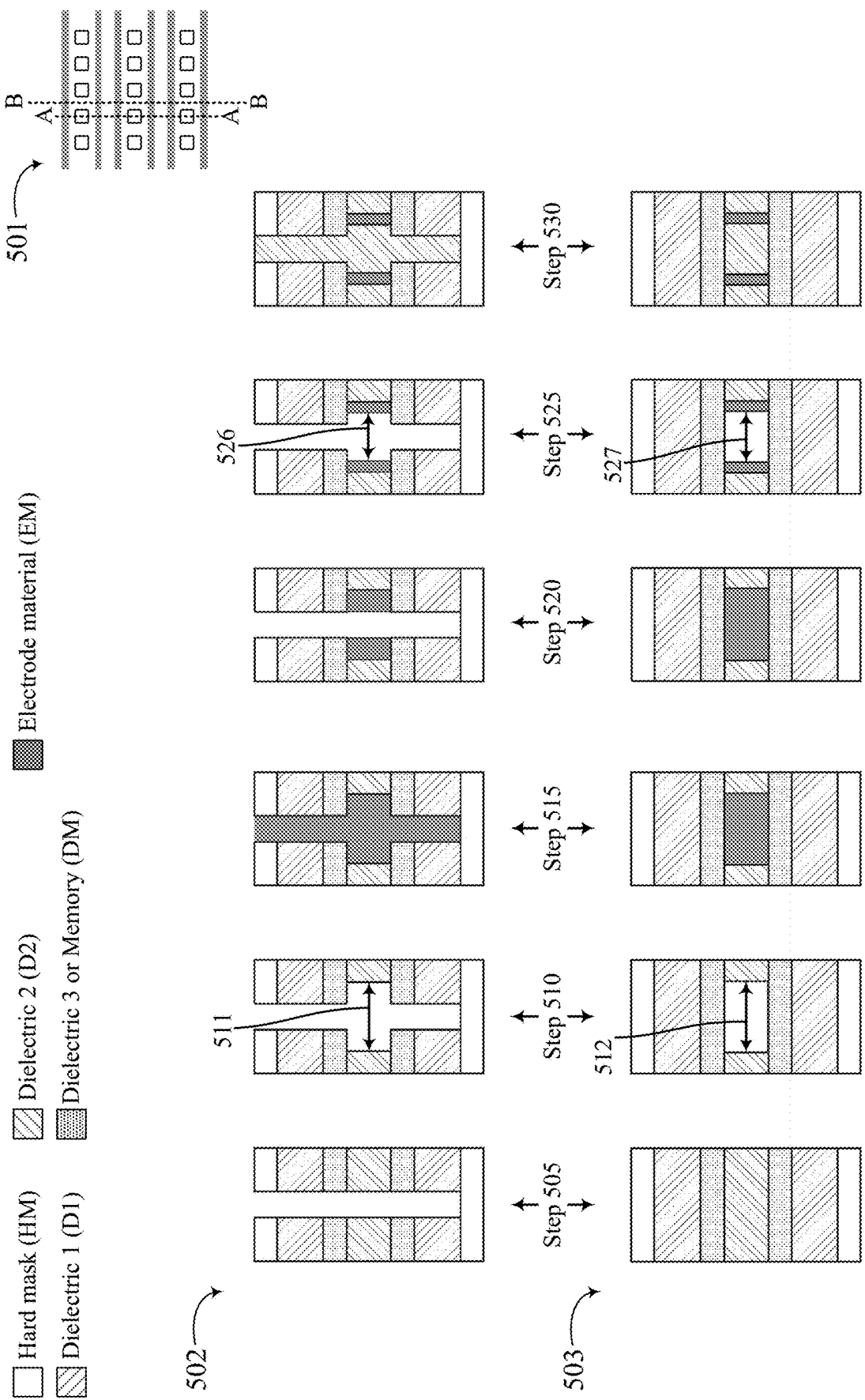

FIG. 5 illustrates example methods of forming buried lines in accordance with fabrication techniques of the present disclosure. In some examples, FIG. 5 depicts the formation of one set of buried lines, with the buried line at a second layer comprising a second dielectric material, which may be referred to as a D2 layer. The stack of layers shown in FIG. 5 may correspond to the stack described above with reference to FIG. 1A. For example, a hardmask (HM) layer may correspond to upper layer 110, a first dielectric layer (e.g., a "D1 layer") may correspond to first layers 115-a and 115-b, a second dielectric layer (e.g., a "D2 layer") may correspond to layer 125, and a third layer may correspond to third layers 120-a 120-b, as described with reference to FIG. 1A. In some examples, the DM layer may include a memory material (e.g., a memory material formed as a part of stack 105-a as described with reference to FIG. 1A). In other examples, the DM layer may include a placeholder material within which a memory material may be deposited. In some examples, the placeholder material may be a third dielectric material, and the DM layer may be referred to as a memory layer or a placeholder layer.

FIG. 5 depicts diagrams 501, 502, and 503. In some examples, diagram 501 may depict a top view of a stack that includes three rows of vias (e.g., vias 210 as described with reference to FIG. 2A) and six buried lines (e.g., word lines) formed using the rows of vias. Each row of vias in diagram 501 may be used to form at least one loop (e.g., a loop 350 or loop 355 as described with reference to FIG. 2A). Accordingly, two buried lines (e.g., word lines or bit lines) may be formed from each loop.

In some examples, diagram 502 may depict a cross-sectional side view of the stack (e.g., stack 205-a as described with reference to FIG. 2A). The cross-sectional side views may correspond to a center of a via shown in diagram 501, denoted by reference line A-A. Additionally or alternatively, diagram 503 may illustrate a cross-sectional side view of the stack (e.g., stack 205-a as described with reference to FIG. 2A) corresponding to a space between the vias of diagram 401, as denoted by reference line B-B.

At processing step 505, a photolithography step may transfer the pattern of vias illustrated in diagram 501 onto the stack of materials. In some examples, the via holes may be referred to as forming a second set of vias. Accordingly the second set of vias may have be formed using a spatial configuration (e.g., a second spatial configuration) that is different from a spatial configuration (e.g., a first spatial configuration) used in the formation of vias at to processing step 405 of FIG. 4. An anisotropic etch step may subsequently remove one or more materials from the stack to create via holes that penetrate the stack. As described above, a via may penetrate a top layer (e.g., upper layer 110 as described with reference to FIG. 1A) and a via hole may extend into the stack (e.g., to first layer 115-a, 115-b as described with reference to FIG. 1A).

In diagram 502, processing step 505 may depict one via (e.g., a first via) and a corresponding via hole that penetrates the stack. This process exposes buried layers of the stack to subsequent processing steps. In diagram 503, processing step 505 may depict that the initial stack (e.g., stack 205 as described with reference to FIG. 2A) remains intact between adjacent vias. Stated another way, diagram 503 may depict that the portion of the stack between adjacent vias may remain unchanged during processing step 505. In some examples, processing step 505 may be an example of processing step 200-b as described with reference to FIG. 2B.

At processing step 510, an isotropic etch step may selectively remove at least a portion of the dielectric material at the second layer (e.g., second layer 125 as described with reference to FIG. 1) in the stack. For example, the isotropic etch step may selectively remove a portion of the second layer that is exposed to an etchant of the isotropic etch. In some examples, the etchant used at processing step 510 may exhibit a selectivity with respect to other materials of the stack (e.g., materials at other layers of the stack). Stated another way, the etchant may selectively remove at least a portion of the second dielectric material at the D2 layer while preserving (e.g., substantially preserving or entirely preserving) other materials (e.g., materials at other layers, such as the DM layer, D1 layer, HM layer) of the stack. By selectively removing, using multiple adjacent vias, at least a portion of the second dielectric material from the second layer, processing step 510 may result in a cavity (e.g., cavity 236 as described with reference to FIG. 2C) at the second layer.

In some examples, a cavity may be created at the second layer while the width of the via hole at other layers remains intact. For example, width 511 may represent a final size of the cavities formed at the second layer, and may be referred to as second width 511. Processing step 510 of diagram 503 may depict that, in some examples, cavities formed at the same layer using adjacent vias may merge, forming a channel (e.g., channel 220 described with reference to FIG. 2A) at the second layers. The channel may be formed due to the isotropic etch step expanding the size of each cavity in multiple directions. The width of the channel (e.g., width 512) may be associated with one or more overlap regions (e.g., overlap regions 225 as described with reference to FIG. 2A). In some examples, width 512 may be a same as width (or approximately a same width) as width 511 in some cases. In other examples, width 512 may be less than width 511.

At processing step 515, each channel may be filled with an electrode material. In some examples, the electrode material may be a conductive material. Excess electrode material may be formed on top of the stack (e.g., on top of HM layer) and may be removed by an etch-back process or chemical-mechanical polishing process. At processing step 515, diagram 503 depicts that the electrode material may flow into the portions of channels between vias, thus concurrently filling each channel. As used herein, via holes filled with a material (e.g., a conductive material) may be referred as holes after having been filled with the material.

At processing step 520, an anisotropic etch step may remove at least a portion of the electrode material. This removal may create new via holes associated with each via. For example, a via hole may be formed at processing step 505 but later filled-in (e.g., by electrode material) at processing step 515. Accordingly a new via hole (e.g., via) may be formed at processing step 520 by removing from the via hole the material with which the via hole and associated channels were filled at processing step 515. The anisotropic etch may use the same via pattern of the HM layer as processing step 505, and may create via holes that expose a sidewall of the electrode material at the second layer.

In some examples, the anisotropic etch step may remove a portion of the electrode material previously filled in to the cavities created at each second layer at processing step 515. Removal of the electrode material may result in loop of remaining electrode material (e.g., a loop 250 as described with reference to FIG. 2A) that surrounds the channel, and the loop may be subsequently severed such that the two elongated sides (e.g., relatively longer sides) of the loop are configured as two distinct electrodes (e.g., a second pair of electrodes; a fifth electrode and a sixth electrode).

At processing step 525, an isotropic etch step may selectively remove at least a portion of the electrode material from each second layer. For example, the isotropic etch step may remove a portion of the electrode material previously filled in to the cavities created at the second layer at processing step 510. The etchant used at processing step 525 may exhibit a selectivity with respect to other materials (e.g., materials at other layers of the stack). For example, the etchant may remove the a portion of the electrode material while preserving (or substantially preserving) other materials (e.g., materials at other layers, such as the DM layer, D2 layer, or HM layer) of the stack. Selective removal of the electrode material may result in the formation of a loop (e.g., a loop 250 as described with reference to FIG. 2A). Thus a width of the loop (e.g., width 526) may be less than second width 511 depicted in processing step 510.

At processing step 525, diagram 503 depicts cavities formed at the second layer. The cavity may have a width 526, which may be a final width of the cavity formed in a respective second layer. Additionally or alternatively, diagram 503 depicts that the cavities formed at the second layer may merge (e.g., adjoin) to form a channel within the first dielectric material. The channel may form, in some examples, due to the isotropic etch expanding the size of each cavity in multiple directions. In some examples, the width of the channel (e.g., width 527) may be a same width (e.g., approximately the same width) as width 526. In other examples, width 527 may be greater than width 526, or may be less than width 526.

At processing step 530, each channel and associated via hole may be filled with a dielectric material. The dielectric material may be a same material the same as the dielectric material at other D2 layers (not shown; e.g., a second dielectric material), or may be a different dielectric material. In some examples, at processing step 530, diagrams 502 and 503 may depict that two or more loops of electrode material (e.g., loop 250 as described with reference to FIG. 2A) have been concurrently formed using a same row of vias. This may form a first loop at a the second layer (e.g., second layer 125 as described with reference to FIG. 1A). In other examples, the stack may include any number of D2 layers having a respective loop of electrode material. Each loop may be formed using the processing steps described above. As used herein, via holes filled with a material (e.g., a dielectric material) may be referred as holes after having been filled with the material.

In other examples (not shown), additional electrode material may be removed. For example, the isotropic etch step may remove an additional portion of the electrode material. The additional removal of the electrode material may result in two additional electrodes (e.g., a third electrode and a fourth electrode) disposed between the first and second electrodes described above. In some examples, the third electrode may be separated from the fourth electrode by a second distance that is greater than the first width.

In some examples, an apparatus that supports buried lines and related fabrication techniques may be described with reference to FIGS. 3 through 5. In some examples, an apparatus may include a stack that includes an upper layer and a first layer. A plurality of holes may be located in the upper layer of the stack, and each hole may have a first width. In some examples, a first electrode may be located at the first layer of the stack, and the first electrode may be aligned with the plurality of first holes. The first electrode may have a second width that is greater than the first width, and in some cases may have a ladder-like shape. In other examples, the stack may include a plurality of second holes in the upper layer of the stack. The plurality of first holes may be disposed in a first row extending in a first direction and the plurality of second holes may be disposed in a second row extending in a second direction that is different than the first direction.

In some examples, a second electrode may be located at the first layer of the stack. The second electrode may be aligned with the plurality of second holes. In some examples, the first electrode may be conjoined with the second electrode.

In other examples, an apparatus may include a stack that includes an upper layer and a first layer. The stack may include a plurality of first holes in the upper layer of the stack, and each first hole may have a first width. In some examples, the stack may include a first electrode and a second electrode at the first layer of the stack. The first electrode may be separated from the second electrode by a first distance greater than the first width. In some examples, a gap may exist between the first electrode and the second electrode, and may be aligned with the plurality of first holes.

In some examples, the stack may include a third electrode and a fourth electrode disposed between the first electrode and the second electrode. The third electrode may be separated from the fourth electrode by a second distance that is greater than the first width. Additionally or alternatively, the first electrode may be separated from the third electrode by a third distance and the second electrode may be separated from the fourth electrode by the third distance. In some examples, the first width may be greater than the third distance. In other examples, the first electrode may be separated from the third electrode by a third distance and the second electrode may be separated from the fourth electrode by the third distance. In some examples, the second distance may be greater than the third distance.

In other examples, the stack may include a plurality of second holes in the upper layer of the stack that each have a second width. In some examples, the stack may include a second layer. The second layer may include a fifth electrode and a sixth electrode. In some examples, the fifth electrode may be separated from the sixth electrode by a fourth distance that is greater than the second width.

Figure 6:
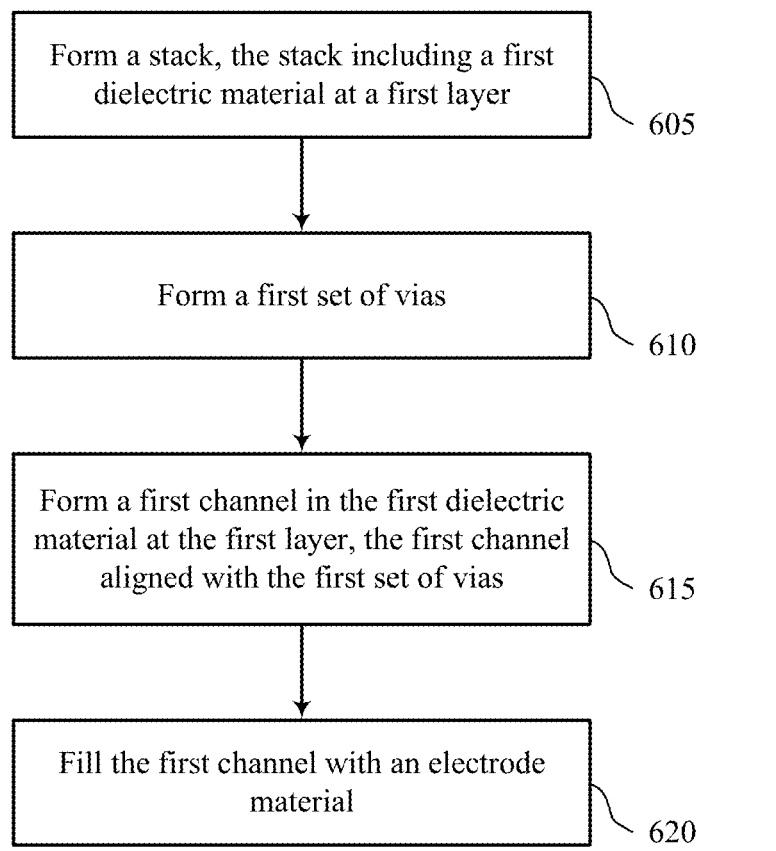
FIGS. 6 through 9 illustrate methods for forming buried lines in accordance with examples of the present disclosure.

FIG. 6 shows a flowchart illustrating a method 600 for forming buried lines in accordance with examples of the present disclosure. The operations of method 600 may be implemented by various fabrication techniques as described herein. For example, the operations of method 600 may be implemented by the fabrication techniques as discussed with reference to FIGS. 3 through 5.

At 605 a stack may be formed. In some examples, the stack may include a first dielectric material at a first layer. The operations of 605 may be performed according to the methods and fabrication techniques described herein. In certain examples, aspects of the operations of 605 may be performed using the fabrication techniques discussed with reference to FIGS. 3 through 5.

At 610 a first set of vias may be formed. The operations of 610 may be performed according to the methods and fabrication techniques described herein. In certain examples, aspects of the operations of 610 may be performed using the fabrication techniques discussed with reference to FIGS. 3 through 5.

At 615 a first channel may be formed in the first dielectric material at the first layer. In some examples, the first channel may be aligned with the first set of vias. The operations of 615 may be performed according to the methods and fabrication techniques described herein. In certain examples, aspects of the operations of 615 may be performed using the fabrication techniques discussed with reference to FIGS. 3 through 5.

At 620 the first channel may be filled with an electrode material. The operations of 620 may be performed according to the methods and fabrication techniques described herein. In certain examples, aspects of the operations of 620 may be performed using the fabrication techniques discussed with reference to FIGS. 3 through 5. In some examples (not shown in FIG. 6), the first channel filled with electrode material may function as an electrode having a width equal to that of the first channel. If first channels are formed at multiple layers using the first set of vias and then filled with the electrode material, the electrode material may be removed from the first set of vias and field with dielectric material so as to isolate the electrodes at each layer (e.g., the electrodes corresponding to each first channel).

Figure 7:
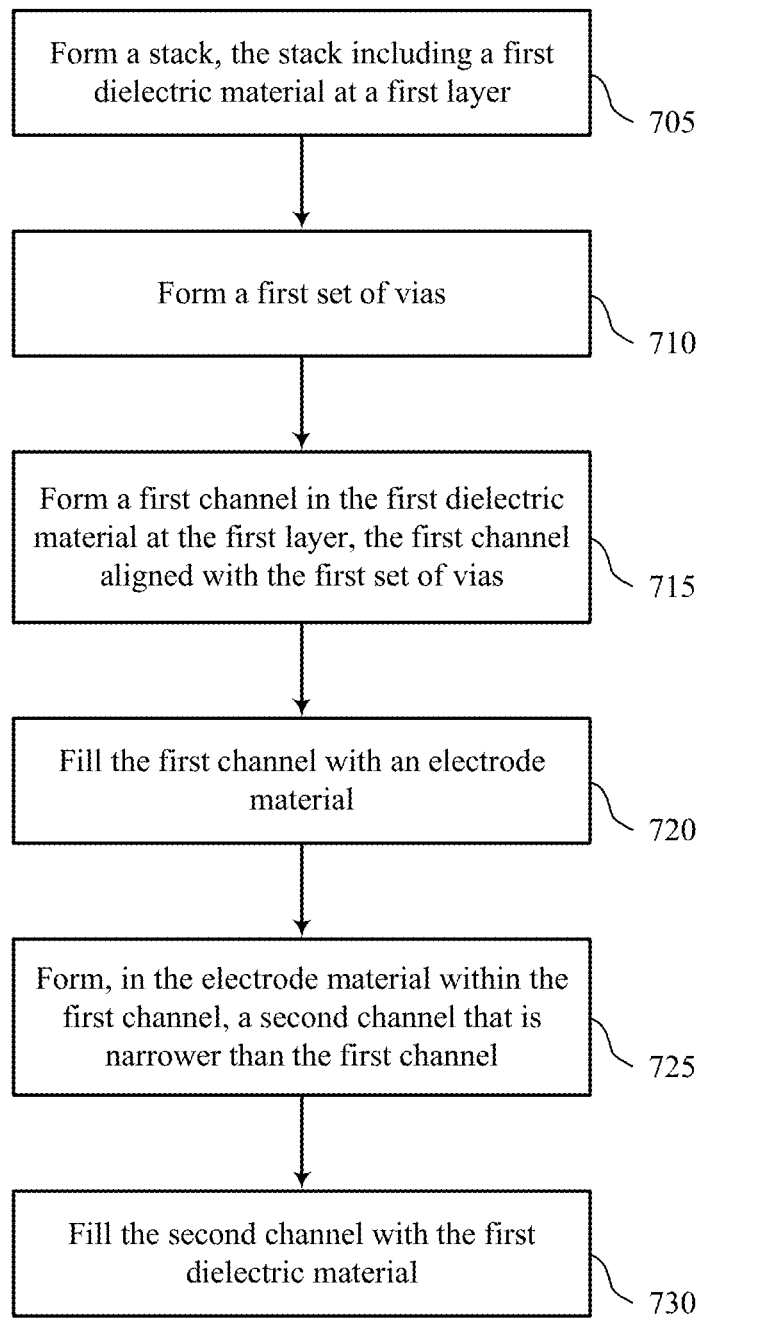

FIG. 7 shows a flowchart illustrating a method 700 for forming buried lines in accordance with examples of the present disclosure. The operations of method 700 may be implemented by various fabrication techniques as described herein. For example, the operations of method 700 may implemented by the fabrication techniques as discussed with reference to FIGS. 3 through 5.

At 705 a stack may be formed. In some examples, the stack may include a first dielectric material at a first layer. The operations of 705 may be performed according to the methods and fabrication techniques described herein. In certain examples, aspects of the operations of 705 may be performed using the fabrication techniques discussed with reference to FIGS. 3 through 5.

At 710 a first set of vias may be formed. The operations of 710 may be performed according to the methods and fabrication techniques described herein. In certain examples, aspects of the operations of 710 may be performed using the fabrication techniques discussed with reference to FIGS. 3 through 5.

At 715 a first channel may be formed in the first dielectric material at the first layer. In some examples, the first channel may be aligned with the first set of vias. The operations of 715 may be performed according to the methods and fabrication techniques described herein. In certain examples, aspects of the operations of 715 may be performed using the fabrication techniques discussed with reference to FIGS. 3 through 5.

At 720 first channel may be filled with an electrode material. The operations of 720 may be performed according to the methods and fabrication techniques described herein. In certain examples, aspects of the operations of 720 may be performed using the fabrication techniques discussed with reference to FIGS. 3 through 5. In some examples (not shown in FIG. 7), the first channel filled with electrode material may function as an electrode having a width equal to that of the first channel. If first channels are formed at multiple layers using the first set of vias and then filled with the electrode material, the electrode material may be removed from the first set of vias and filled with dielectric material so as to isolate the electrodes at each layer (e.g., the electrodes corresponding to each first channel).

At 725 a second channel may be formed, in the electrode material within the first channel, that is narrower than the first channel. The operations of 725 may be performed according to the methods and fabrication techniques described herein. In certain examples, aspects of the operations of 725 may be performed using the fabrication techniques discussed with reference to FIGS. 3 through 5.

At 730 the second channel may be filled with the first dielectric material. The operations of 730 may be performed according to the methods and fabrication techniques described herein. In certain examples, aspects of the operations of 730 may be performed using the fabrication techniques discussed with reference to FIGS. 3 through 5. Alternatively, the second channel may be filled with a different dielectric material.

In some cases, the method may also include forming a stack that includes a first dielectric material at a first layer. In some examples, the method may include filling the additional channel with the electrode material. In other examples, the method may include forming a first channel in the first dielectric material at the first layer. The first channel may be aligned with the first set of vias. Additionally or alternatively, the method may include filling the first channel with an electrode material.

In some examples, forming the first channel may include removing, through the first set of vias, a portion of the first dielectric material from the first layer to form a corresponding set of contiguous first cavities in the first dielectric material at the first layer. In some cases, the method may include forming, in the electrode material within the first channel, a second channel that is narrower than the first channel. Additionally or alternatively, the method may include filling the second channel with the first dielectric material. In some examples, the second channel may be filled with a dielectric material other than the first dielectric material (e.g., a second dielectric material, a filler dielectric material). Stated another way, the first channel and the second channel may be filled with a same or a different dielectric material. The method may also include forming the second channel to create a loop of electrode material at the first layer.

In other examples, forming the second channel may include removing, through the first set of vias, a portion of the electrode material from the first channel to form a corresponding set of second cavities in the electrode material in the first channel. In some examples, contiguous second cavities merge to form the second channel. The method may also include forming a first set of vias. In some examples, the method may include forming a second set of vias. Additionally or alternatively, the method may include forming a first extension of the first channel in the first dielectric material at the first layer, the first extension aligned with the second set of vias. In some cases, the method may include filling the first extension with the electrode material.

Additionally or alternatively, the method may include removing, through the first set of vias and the second set of vias, a portion of the first dielectric material from the first layer. The first set of vias may be disposed in a first row extending in a first direction and the second set of vias may be disposed in a second row extending in a second direction that is different than the first direction. In some examples, a width of the first channel may be based at least in part on a spacing of each via in the second set of vias. In other examples, the method may include forming a third set of vias, wherein the second set of vias extend in a second direction and the third set of vias extend in a third direction that is different than the second direction.

In some examples, the method may include forming an additional set of vias through the stack, the stack comprising a second dielectric material at a second layer. In other cases, the method may include forming an additional channel in the second dielectric material at the second layer. The additional channel may be aligned with the additional set of vias. Additionally or alternatively, the method may include forming the fourth channel that creates a set of concentric loops of electrode material at the first layer.

Figure 8:
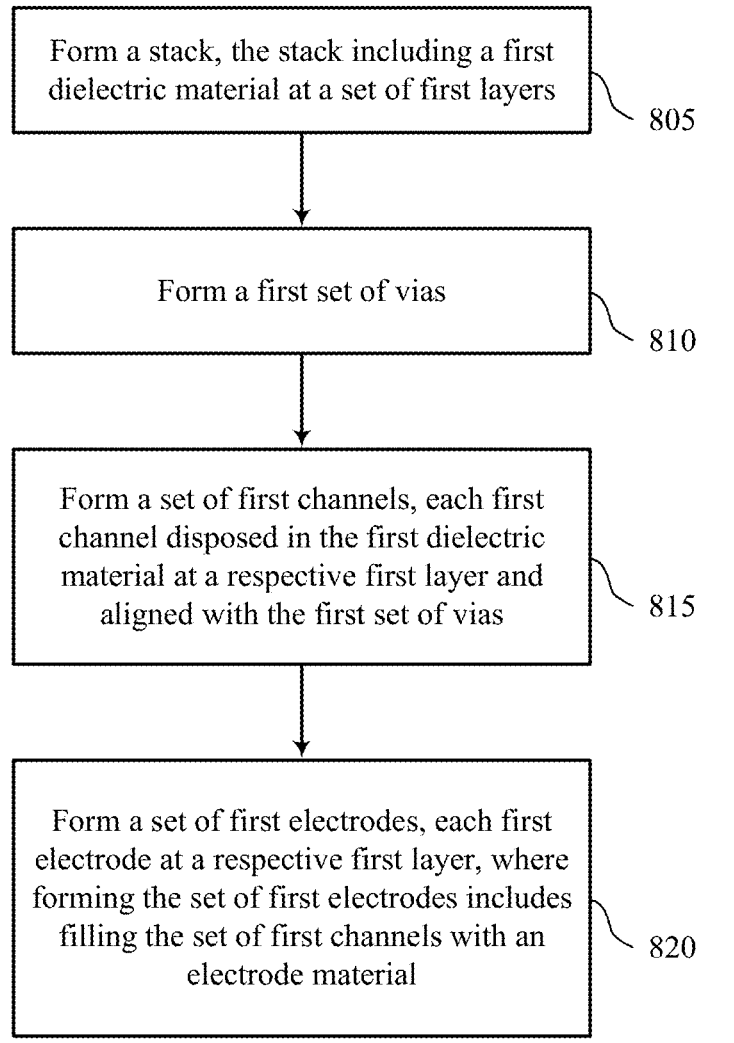

FIG. 8 shows a flowchart illustrating a method 800 for forming buried lines in accordance with examples of the present disclosure. The operations of method 800 may be implemented by various fabrication techniques as described herein. For example, the operations of method 800 may implemented by the fabrication techniques as discussed with reference to FIGS. 13 through 5.

At 805 a stack may be formed. The stack may include a first dielectric material at a plurality of first layers. The operations of 805 may be performed according to the methods and fabrication techniques described herein. In certain examples, aspects of the operations of 805 may be performed using the fabrication techniques discussed with reference to FIGS. 3 through 5.

At 810 a first set of vias may be formed. The operations of 810 may be performed according to the methods and fabrication techniques described herein. In certain examples, aspects of the operations of 810 may be performed using the fabrication techniques discussed with reference to FIGS. 3 through 5.

At 815 a plurality of first channels may be formed. Each first channel may be disposed in the first dielectric material at a respective first layer and aligned with the first set of vias. The operations of 815 may be performed according to the methods and fabrication techniques described herein. In certain examples, aspects of the operations of 815 may be performed using the fabrication techniques discussed with reference to FIGS. 3 through 5.

At 820 a plurality of first electrodes may be formed. Each first electrode may be formed at a respective first layer, and forming the plurality of first electrodes may include filling the plurality of first channels with an electrode material. The operations of 820 may be performed according to the methods and fabrication techniques described herein. In certain examples, aspects of the operations of 820 may be performed using the fabrication techniques discussed with reference to FIGS. 3 through 5. In some examples (not shown in FIG. 8), the electrode material may be removed from the first set of vias and filled with dielectric material so as to isolate the electrodes at each layer (e.g., the electrodes corresponding to each first channel).

Figure 9:
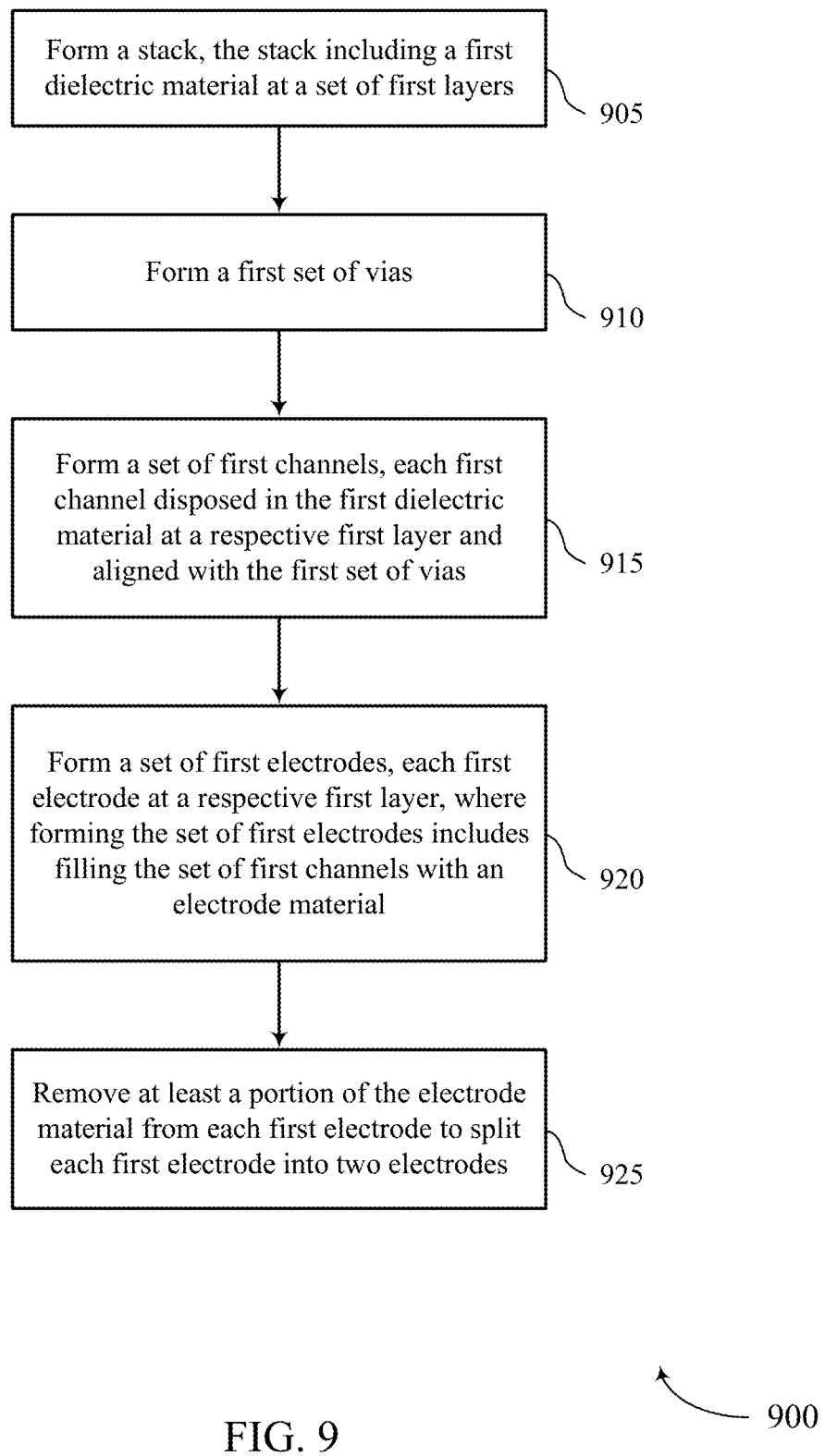

FIG. 9 shows a flowchart illustrating a method 900 for forming buried lines in accordance with examples of the present disclosure. The operations of method 900 may be implemented by various fabrication techniques as described herein. For example, the operations of method 900 may implemented by the fabrication techniques as discussed with reference to FIGS. 3 through 5.

At 905 a stack may be formed. The stack may include a first dielectric material at a plurality of first layers. The operations of 905 may be performed according to the methods and fabrication techniques described herein. In certain examples, aspects of the operations of 905 may be performed using the fabrication techniques discussed with reference to FIGS. 3 through 5.

At 910 a first set of vias may be formed. The operations of 910 may be performed according to the methods and fabrication techniques described herein. In certain examples, aspects of the operations of 910 may be performed using the fabrication techniques discussed with reference to FIGS. 3 through 5.

At 915 a plurality of first channels may be formed. Each first channel may be disposed in the first dielectric material at a respective first layer and aligned with the first set of vias. The operations of 915 may be performed according to the methods and fabrication techniques described herein. In certain examples, aspects of the operations of 915 may be performed using the fabrication techniques discussed with reference to FIGS. 3 through 5.

At 920 a plurality of first electrodes may be formed. Each first electrode may be formed at a respective first layer, and forming the plurality of first electrodes may include filling the plurality of first channels with an electrode material. The operations of 920 may be performed according to the methods and fabrication techniques described herein. In certain examples, aspects of the operations of 920 may be performed using the fabrication techniques discussed with reference to FIGS. 3 through 5.

At 925 at least a portion of the electrode material may be removed from each first electrode to split each first electrode into a respective pair of first electrodes. The operations of 925 may be performed according to the methods and fabrication techniques described herein. In certain examples, aspects of the operations of 925 may be performed using the fabrication techniques discussed with reference to FIGS. 3 through 5.

In some cases, the method may include forming a stack. The stack may include a first dielectric material at a plurality of first layers. In some examples, the method may include forming a first set of vias through the stack. The method may also include forming a plurality of first channels, each first channel disposed in the first dielectric material at a respective first layer and aligned with the first set of vias.

In some examples, the method may include forming a plurality of first electrodes, each first electrode at a respective first layer, wherein forming the plurality of first electrodes comprises filling the plurality of first channels with an electrode material. In other examples, the method may include removing at least a portion of the electrode material from each first electrode to split each first electrode into two electrodes. Additionally or alternatively, the methods described above may include removing one or more portions of electrode material at one or more layers (e.g., at first layer, at a second layer). The methods may also include filling the respective layer with a dielectric material (e.g., a first dielectric material).

It should be noted that the methods described above describe possible implementations, and that the operations and the steps may be rearranged or otherwise modified and that other implementations are possible. Furthermore, examples from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

The term "layer" used herein refers to a stratum or sheet of a geometrical structure. Each layer may have three dimensions (e.g., height, width, and depth) and may cover some or all of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature As used herein, the term "substantially" means that the modified characteristic (e.g., a verb or adjective modified by the term substantially) need not be absolute but is close enough so as to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of a memory array.

The term "photolithography," as used herein, may refer to the process of patterning using photoresist materials and exposing such materials using electromagnetic radiation. For example, a photoresist material may be formed on a base material by, for example, spin-coating the photoresist on the base material. A pattern may be created in the photoresist by exposing the photoresist to radiation. The pattern may be defined by, for example, a photo mask that spatially delineates where the radiation exposes the photoresist. Exposed photoresist areas may then be removed, for example, by chemical treatment, leaving behind the desired pattern. In some cases, the exposed regions may remain and the unexposed regions may be removed.

Chalcogenide materials may be materials or alloys that include at least one of the elements S, Se, and Te. Phase change materials discussed herein may be chalcogenide materials. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer. Other examples of variable resistance materials may include binary metal oxide materials or mixed valence oxide including two or more metals, e.g., transition metals, alkaline earth metals, and/or rare earth metals. Embodiments are not limited to a particular variable resistance material or materials associated with the memory elements of the memory cells. For example, other examples of variable resistance materials can be used to form memory elements and may include chalcogenide materials, colossal magnetoresistive materials, or polymer-based materials, among others.

The term "isolated" refers to a relationship between components in which electrons are not presently capable of flowing between them; components are isolated from each other if there is an open circuit between them. For example, two components physically connected by a switch may be isolated from each other when the switch is open.

The devices discussed herein may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    forming a stack, the stack comprising a first dielectric material at a first layer;
    forming a first set of vias in a top layer of the stack;
    forming a first set of via holes in the stack using the first set of vias;
    forming a first channel in the first dielectric material at the first layer by removing a first portion of the first dielectric material from the first layer using the first set of via holes and the first set of vias, wherein a remaining portion of the first dielectric material at least partially surrounds the first channel;
    filling the first channel with an electrode material;
    forming, in the electrode material within the first channel, a second channel that is narrower than the first channel; and
    filling the second channel with the first dielectric material.

2. The method of claim 1, wherein forming the first channel comprises:
    forming a set of first cavities in the first dielectric material at the first layer based at least in part on removing the first portion of the first dielectric material, wherein each first cavity respectively corresponds to a via in the first set of vias and a via hole in the first set of via holes, and wherein contiguous first cavities merge to form the first channel.

3. The method of claim 1, wherein forming the second channel creates a loop of electrode material at the first layer.

4. The method of claim 1, wherein forming the second channel comprises:
    removing, through the first set of vias, a portion of the electrode material from the first channel to form a corresponding set of second cavities in the electrode material in the first channel, wherein contiguous second cavities merge to form the second channel.

5. The method of claim 1, further comprising:
    forming, in the first dielectric material within the second channel, a third channel that is narrower than the second channel; and
    filling the third channel with the electrode material.

6. The method of claim 5, further comprising:
    forming, in the electrode material within the third channel, a fourth channel that is narrower than the third channel; and
    filling the fourth channel with the first dielectric material.

7. The method of claim 6, wherein forming the fourth channel creates a set of concentric loops of electrode material at the first layer.

8. The method of claim 1, further comprising:
    forming a second set of vias in the top layer of the stack;
    forming a second set of via holes in the stack using the first set of vias;
    forming a first extension of the first channel in the first dielectric material at the first layer by removing a second portion of the first dielectric material from the first layer using the second set of via holes and the second set of vias, wherein the remaining portion of the first dielectric material at least partially surrounds the second channel; and filling the first extension with the electrode material.

9. The method of claim 8, wherein forming the first extension comprises:

forming a set of second cavities in the first dielectric material at the first layer based at least in part on removing the second portion of the first dielectric material, wherein each second cavity respectively corresponds to a via in the second set of vias and a via hole in the second set of via holes, and wherein contiguous second cavities merge to form the first extension, and wherein a second cavity merges with a first cavity to merge the first extension with the first channel.

10. The method of claim 8, wherein the first set of vias are disposed in a first row extending in a first direction and the second set of vias are disposed in a second row extending in a second direction that is different than the first direction.

11. The method of claim 1, wherein a width of the first channel is based at least in part on a spacing of each via in the first set of vias.

12. The method of claim 8, further comprising:

forming a third set of vias, wherein the first set of vias are disposed in a first row extending in a first direction, the second set of vias are disposed in a second row extending in a second direction, and the third set of vias are disposed in a third row extending in a third direction that is different than the second direction.

13. The method of claim 8, wherein the first channel and the first extension of the first channel are formed concurrently.

14. The method of claim 1, further comprising:

forming an additional set of vias in the top layer of the stack;

forming an additional set of via holes in the stack using the additional set of vias;

forming an additional channel in a second dielectric material at a second layer of the stack by removing a portion of the second dielectric material from the second layer using the additional set of via holes and the additional set of vias, wherein a remaining portion of the second dielectric material at least partially surrounds the additional channel; and filling the additional channel with the electrode material.

* * * * *